(12) United States Patent
Ikedo et al.

(10) Patent No.: US 9,201,129 B2
(45) Date of Patent: Dec. 1, 2015

(54) MAGNETIC-RESONANCE IMAGE DIAGNOSTIC APPARATUS AND METHOD OF CONTROLLING THE SAME

(75) Inventors: Masato Ikedo, Otawara (JP); Tokunori Kimura, Yaita (JP)

(73) Assignees: KABUSHIKI KAISHA TOSHIBA, Tokyo (JP); TOSHIBA MEDICAL SYSTEMS CORPORATION, Tochigi (JP)

( * ) Notice: Subject to any disclaimer, the term of this patent is extended or adjusted under 35 U.S.C. 154(b) by 618 days.

(21) Appl. No.: 11/898,299

(22) Filed: Sep. 11, 2007

(65) Prior Publication Data

US 2008/0071167 A1    Mar. 20, 2008

(30) Foreign Application Priority Data

Sep. 13, 2006 (JP) ................................. 2006-248402
May 18, 2007 (JP) ................................. 2007-133193

(51) Int. Cl.
| | |
|---|---|
| A61B 5/05 | (2006.01) |
| G01R 33/563 | (2006.01) |
| G01R 33/54 | (2006.01) |
| G01R 33/56 | (2006.01) |

(Continued)

(52) U.S. Cl.
CPC ...... G01R 33/5635 (2013.01); G01R 33/56316 (2013.01); *G01R 33/543* (2013.01); *G01R 33/5602* (2013.01); *G01R 33/5607* (2013.01); *G01R 33/5611* (2013.01); *G01R 33/56509* (2013.01)

(58) Field of Classification Search
USPC ................... 600/406, 410, 409; 324/306–309
See application file for complete search history.

(56) References Cited

U.S. PATENT DOCUMENTS

| | | | |
|---|---|---|---|
| 5,572,124 A | 11/1996 | Bito et al. | |
| 5,853,365 A | 12/1998 | Yamagata | |
| 6,043,650 A | 3/2000 | Taniguchi et al. | |

(Continued)

FOREIGN PATENT DOCUMENTS

| | | |
|---|---|---|
| CN | 1751658 A | 3/2006 |
| EP | 1 408 341 A2 | 4/2004 |

(Continued)

OTHER PUBLICATIONS

Partial European Search Report dated Aug. 4, 2009 in EP 07 01 7886 and Communication of Partial European Search Report dated Aug. 14, 2009.

(Continued)

*Primary Examiner* — Tse Chen
*Assistant Examiner* — Joel F Brutus
(74) *Attorney, Agent, or Firm* — Nixon & Vanderhye P.C.

(57) ABSTRACT

A magnetic resonance imaging diagnostic apparatus includes a generating unit which generates a slice gradient magnetic field, a phase-encode gradient magnetic field and a read-out gradient magnetic field that extend in a slice axis, a phase-encode axis and a read-out axis, respectively, a setting unit which sets a dephase amount for weighting a signal-level decrease resulting from flows in the arteries and veins present in a region of interest of a subject, with respect to at least one axis selected form the slice axis, phase-encode axis and read-out axes, and a control unit which controls the generating unit by using a pulse sequence for a gradient echo system, which includes a dephase gradient-magnetic-field pulse that corresponds to the dephase amount set by the setting unit for the at least one axis.

44 Claims, 24 Drawing Sheets

(51) Int. Cl.
*G01R 33/561* (2006.01)
*G01R 33/565* (2006.01)

(56) References Cited

U.S. PATENT DOCUMENTS

| | | | |
|---|---|---|---|
| 6,046,590 A * | 4/2000 | Hinks et al. | 324/309 |
| 6,380,739 B1 * | 4/2002 | Machida | 324/309 |
| 6,381,486 B1 * | 4/2002 | Mistretta et al. | 600/420 |
| 6,501,272 B1 | 12/2002 | Haacke | |
| 6,658,280 B1 * | 12/2003 | Haacke | 600/410 |
| 6,751,495 B2 * | 6/2004 | Maier et al. | 600/410 |
| 7,020,314 B1 * | 3/2006 | Suri et al. | 382/130 |
| 2001/0004311 A1 * | 6/2001 | Negishi | 361/695 |
| 2002/0032376 A1 * | 3/2002 | Miyazaki et al. | 600/410 |
| 2004/0068175 A1 * | 4/2004 | Miyazaki et al. | 600/410 |
| 2005/0065430 A1 * | 3/2005 | Wiethoff et al. | 600/413 |
| 2006/0043970 A1 * | 3/2006 | Zaharchuk et al. | 324/307 |

FOREIGN PATENT DOCUMENTS

| | | |
|---|---|---|
| JP | 05-207982 | 8/1993 |
| JP | 5-207982 | 8/1993 |
| JP | 07-184875 | 7/1995 |
| JP | 09-238912 | 9/1997 |
| JP | 11-253417 | 9/1999 |
| JP | 2000-279390 | 10/2000 |
| JP | 2000-300537 | 10/2000 |
| JP | 2002-200054 | 7/2002 |
| JP | 2003-70766 | 3/2003 |
| JP | 2004-129724 | 4/2004 |
| JP | 2006-509567 | 3/2006 |
| JP | 2008-501427 | 1/2008 |
| JP | 2008-093418 | 4/2008 |
| JP | 2009-534116 | 9/2009 |
| WO | 03/021284 A | 3/2003 |
| WO | 03/098233 A2 | 11/2003 |
| WO | 2005/084540 | 9/2005 |
| WO | 2007/046172 | 4/2007 |

OTHER PUBLICATIONS

Kimura T. et al., "Flow-Sensitive Susceptibility-Weighted Imaging," Proceedings of the International Society for Magnetic Resonance in Medicine, Joint Annual Meeting ISMRM-ESMRMB, Berlin, Germany, May 19-25, 2007, p. 3015, XP002539972.

Ro YM, Lee ET, "Phase-dependent-image enhancement in magnetic resonance imaging," SPIE Conference on Physics of Medical Imaging, San Diego, California, USA, Feb. 1998, vol. 3336, Feb. 1998, pp. 761-770, XP002539973.

Haacke et al.: "Susceptibility Weighted Imaging (SWI),"*Magnetic Resonance in Medicine*, pp. 612-618 (2004).

Extended European Search Report mailed Dec. 8, 2009 in EP 07 01 7886.

Ringgaard S. et al., "Arterial MR Imaging Phase-Contrast Flow Measurement: Improvements with Varying Velocity Sensitivity during Cardiac Cycle," Radiology, vol. 232, 2004, pp. 289-294, XP002557193.

Chong D.G., et al., "Phase Contrast Measurements of Microscopic Cardiac-Induced Brain Tissue Pulsations," Proceedings of the International Society for Magnetic Resonance in Medicine, 13th Scientific Meeting and Exhibition, Miami Beach, Florida, USA, May 7-13, 2005, p. 1097, XP002557194.

Communication of Extended European Search Report dated Oct. 7, 2011 with attached European Search Report for EP 11162707.1-2209.

Kimura, T., et al., "Flow-Sensitive Susceptibility-Weighted Imaging," Proceedings of the International Society for Magnetic Resonance in Medicine, Joint Annual Meeting ISMRM-ESMRMB, Berlin, Germany, May 19-25, 2007, p. 3015, XP-002539972.

Lenz, G.W., et al., "In-Plane Vascular Imaging: Pulse Sequence Design and Strategy," Radiology, Radiological Society of North America, Oak Brook, IL, v. 166, No. 3, Mar. 1, 1988, pp. 875-882, XP009043826.

Ro, Y. M. and Lee, E-T., "Phase Dependent-Image Enhancement in Magnetic Resonance Imaging," SPIE Conference on Physics of Medical Imaging, San Diego, Cal., Feb. 1998, SPIE vol. 3336, pp. 761-770, XP-002539973.

Notification of European publication number and information on the application of Article 67(e) EPC for EP 11176447.8-2209/2392936; Communication of Extended European Search Report dated Nov. 8, 2011 with attached European Search Report for EP 11176447.8-2209.

Hongyu A., et al., "Impact of Intravascular Signal on Quantitative Measures of Cerebral Oxygen Extraction and Blood Volume Under Normo- and Hypercapnic Conditions Using an Asymmetric Spin Echo Approach," Magnetic Resonance in Medicine, vol. 50, No. 4, Sep. 26, 2003, pp. 708-716, XP55010477, ISSN: 0740-3194.

Communication of Extended European Search Report dated Nov. 9, 2011 with attached European Search Report for EP 11176453.6-2209/2392937; Notification of European publication number and information on the application of Article 67(3) EPC for EP 11176453.6-2209/2392392937.

H Bosmans et al., "Flow-Dependent Acquisition Techniques," in "Magnetic Resonance Angiography," Jan. 1, 2002, Springer, pp. 85-90, XP55010391, ISBN: 978-3-54-043975-2.

Office Action mailed Jan. 24, 2012 in JP 2017-133193 with English translation.

Office Action mailed Jul. 24, 2012 in JP Patent Application No. 2007-226154 with English translation.

Office Action dated Jul. 23, 2012 in CN Patent Application No. 201110226132.2 with English translation.

Zu Donglin, Nuclear Magnetic Resonance Imaging Learning, pp. 346-351, Higher Education Publishing Company, Jan. 31, 2004.

* cited by examiner

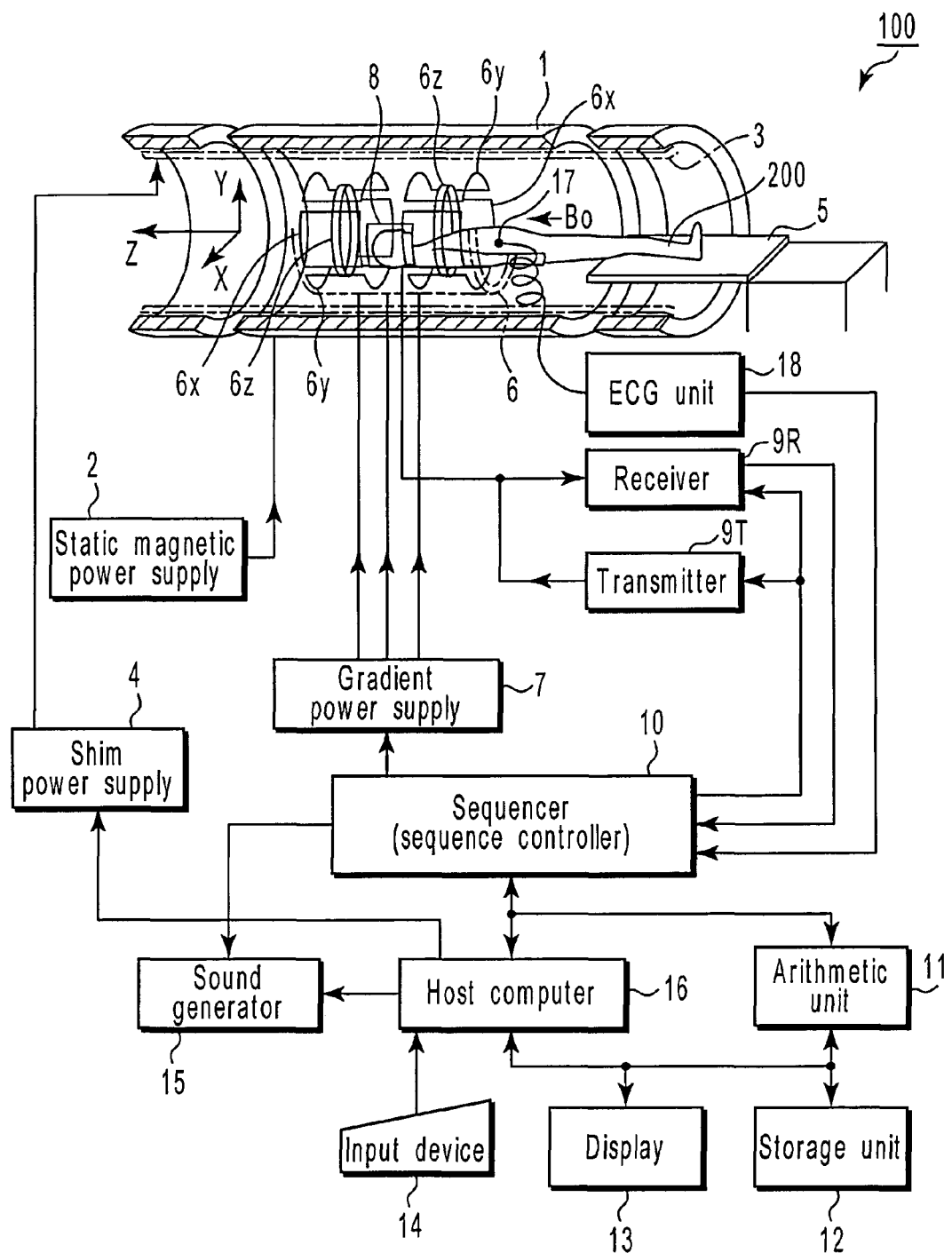
F I G. 1

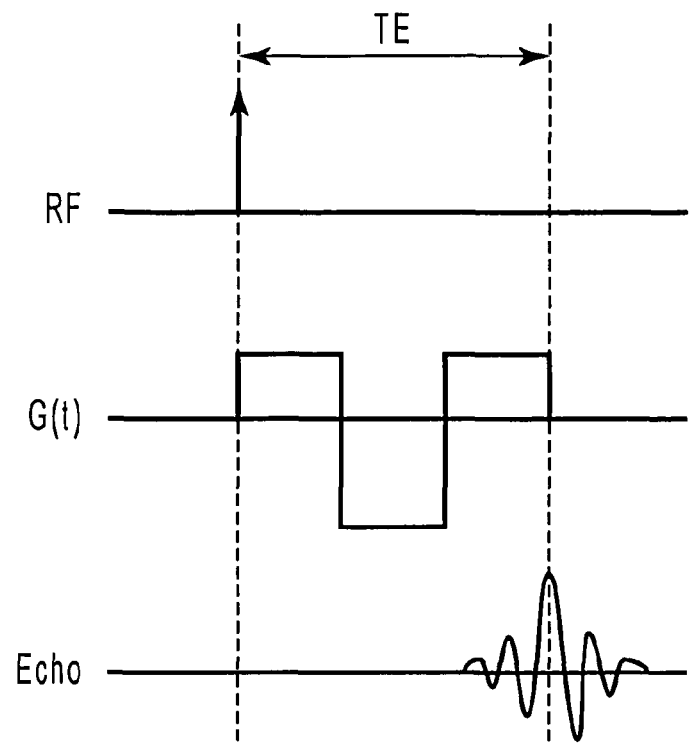
F I G. 4
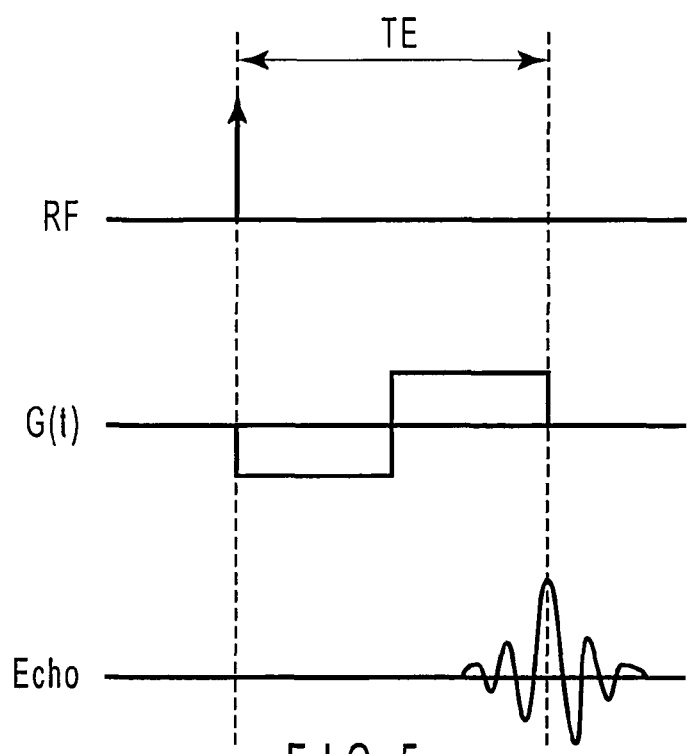
F I G. 5

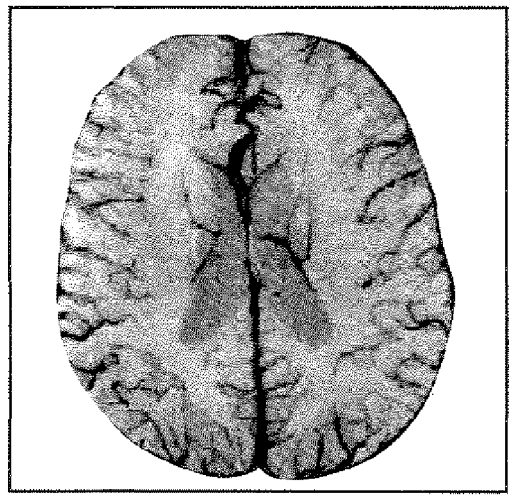
F I G. 6A

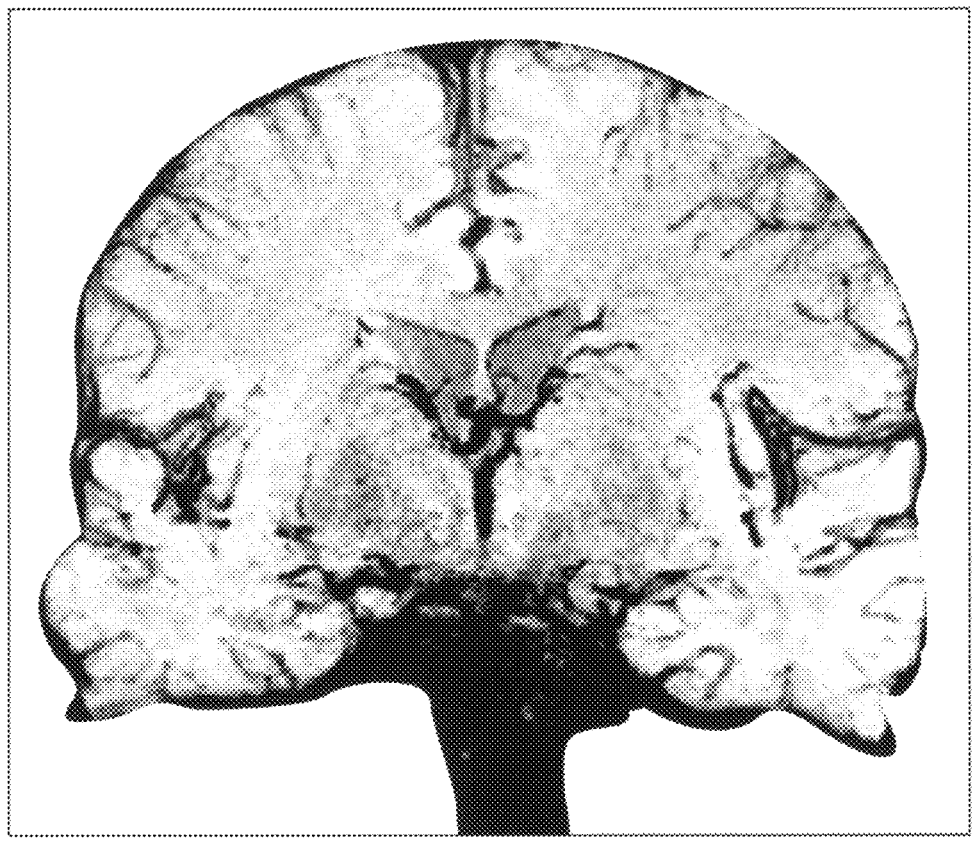
F I G. 11

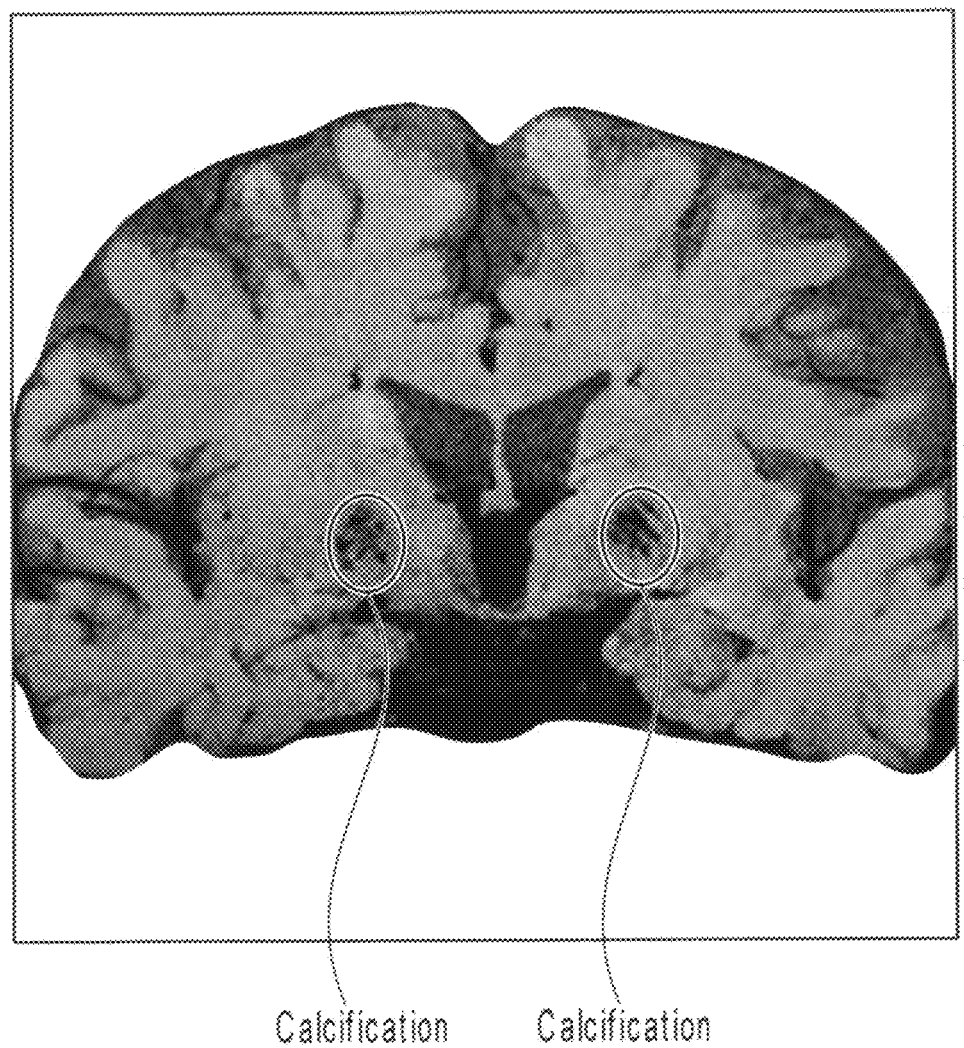
F I G. 16

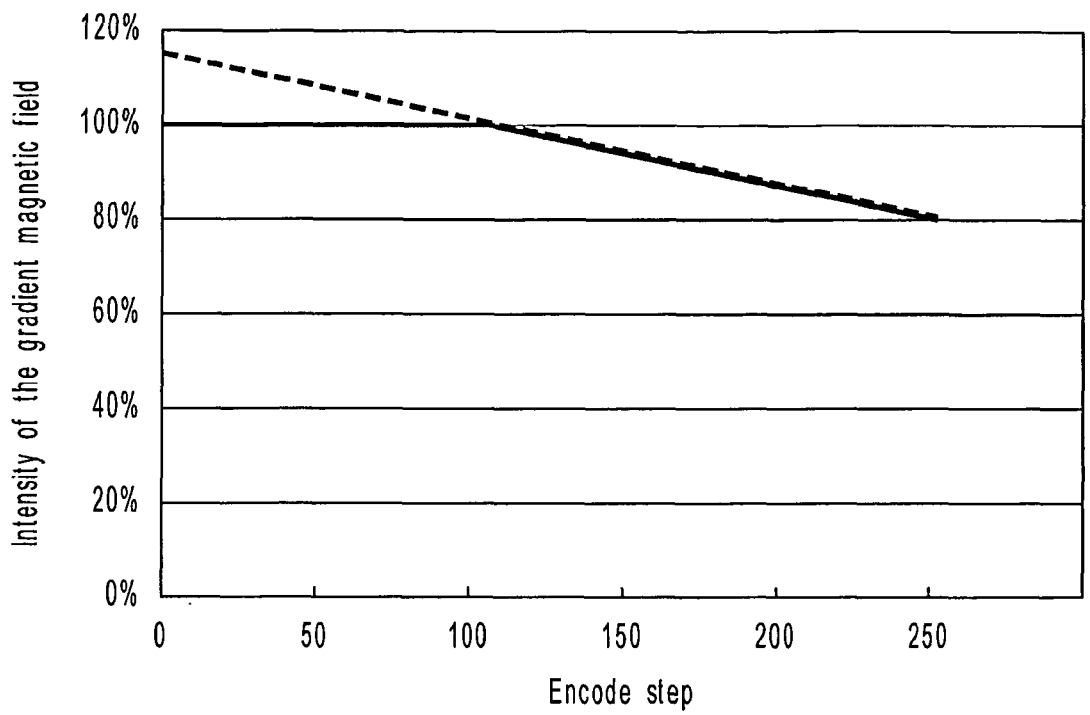
F I G. 19
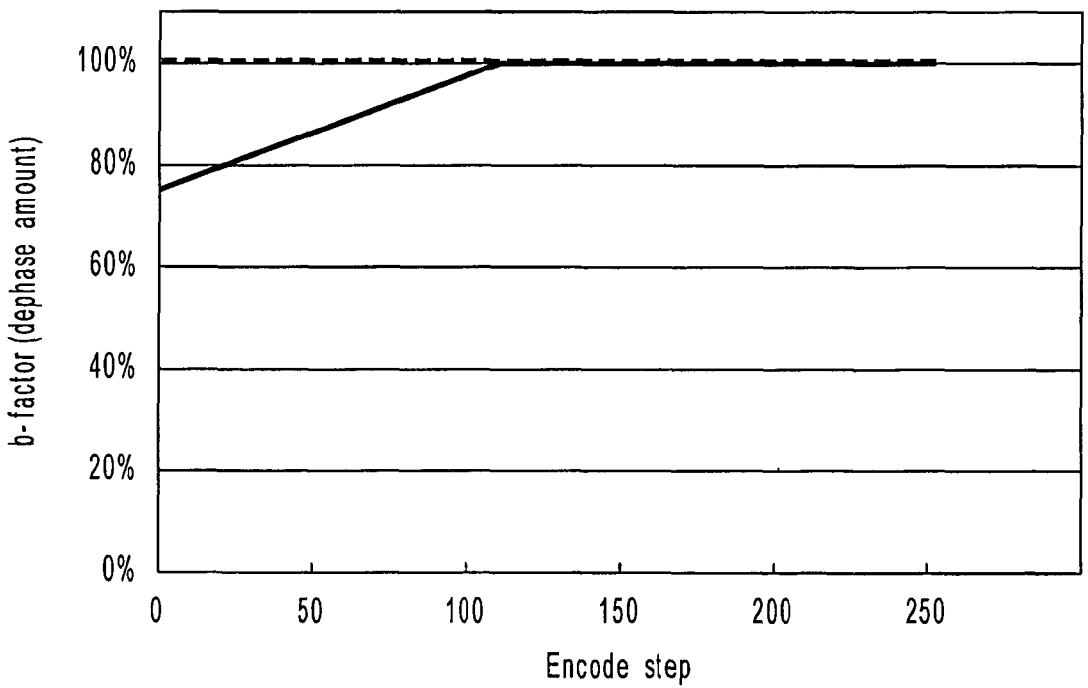
F I G. 20

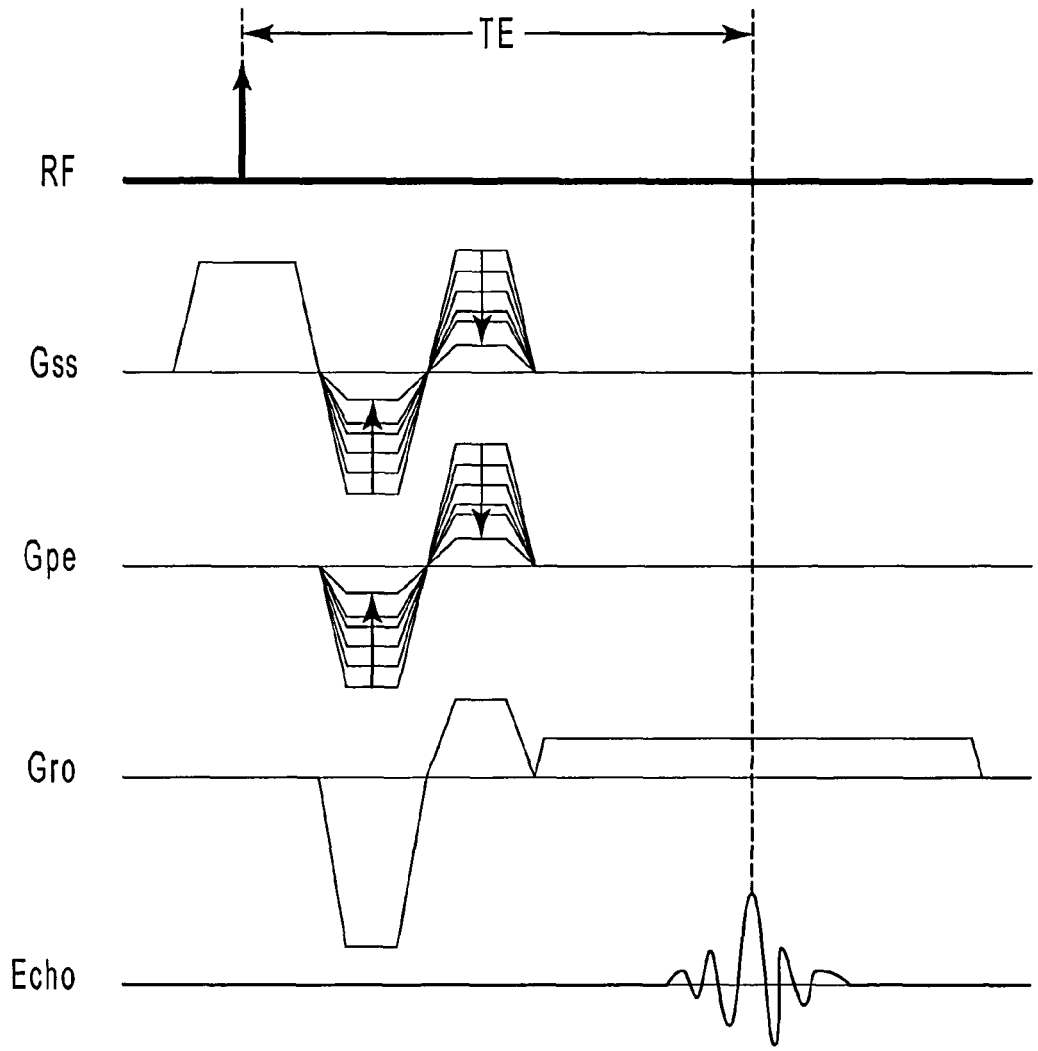
F I G. 21

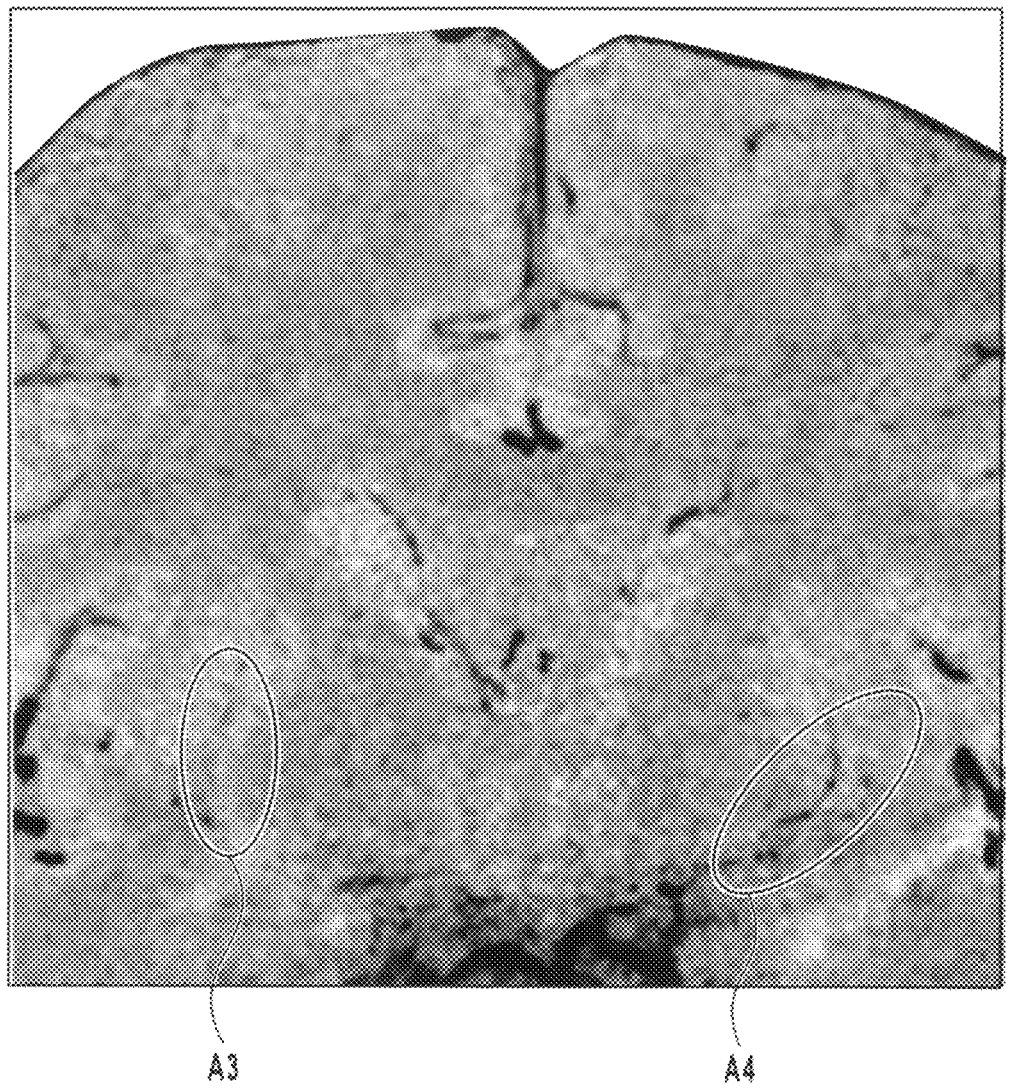
F I G. 24

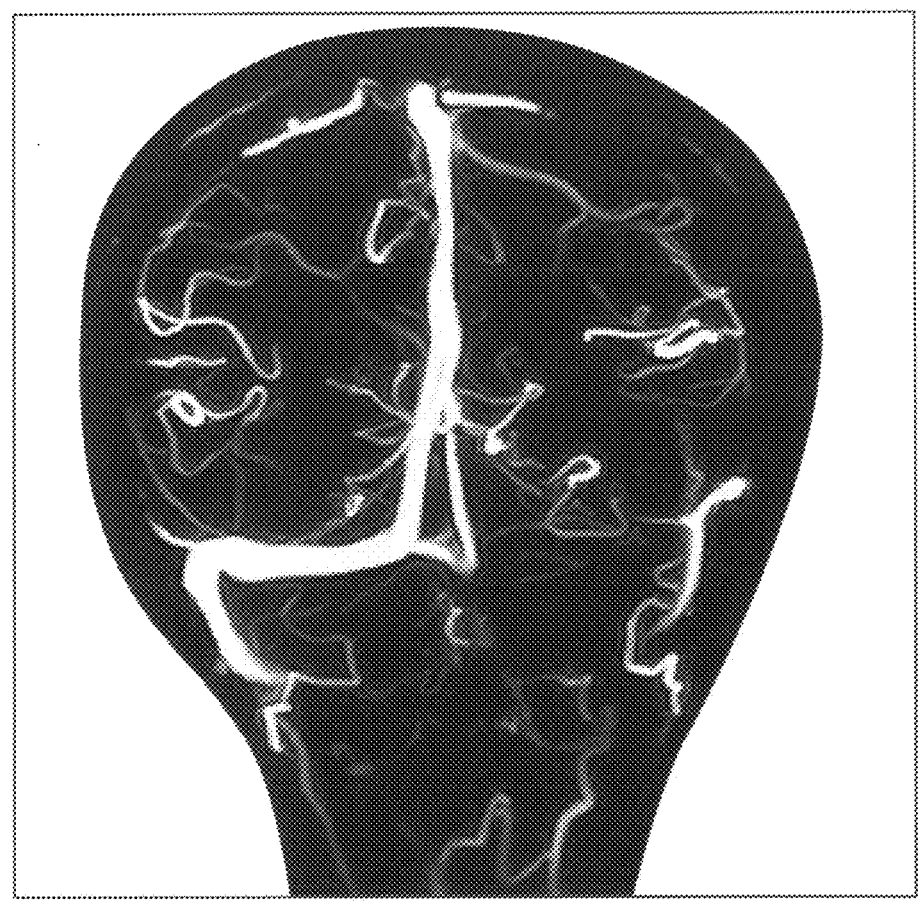
F I G. 25

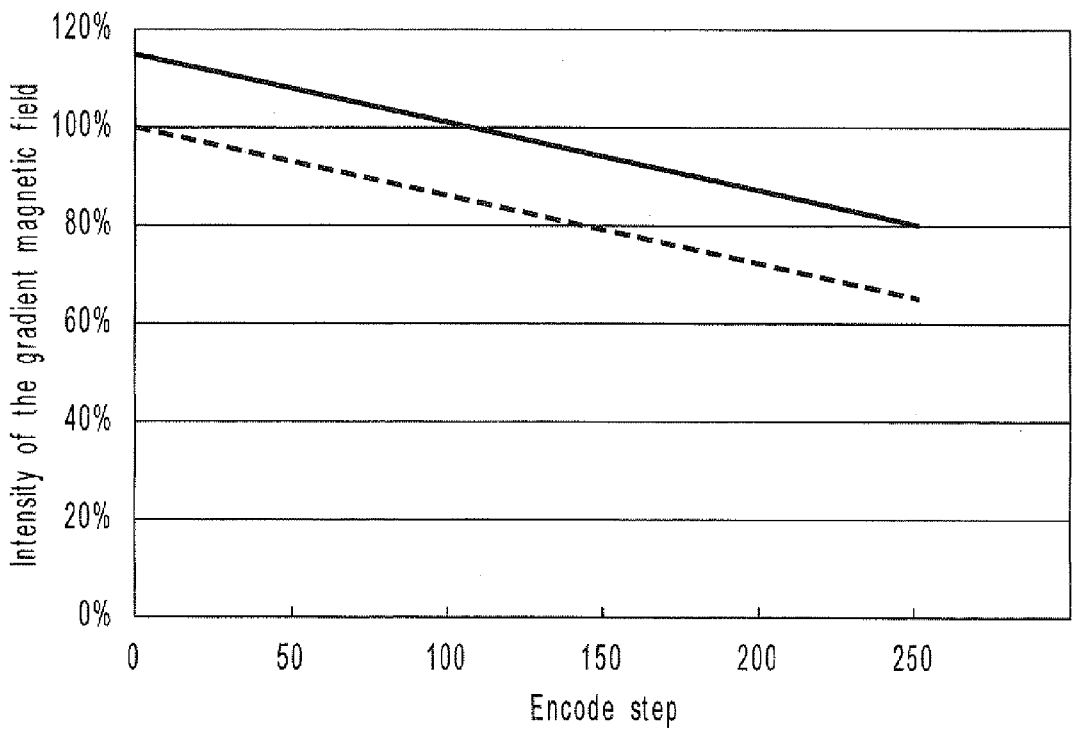
F I G. 27

MAGNETIC-RESONANCE IMAGE DIAGNOSTIC APPARATUS AND METHOD OF CONTROLLING THE SAME

CROSS-REFERENCE TO RELATED APPLICATIONS

This application is based upon and claims the benefit of priority from prior Japanese Patent Applications No. 2006-248402, filed Sep. 13, 2006; and No. 2007-133193, filed May 18, 2007, the entire contents of both of which are incorporated herein by reference.

BACKGROUND OF THE INVENTION

1. Field of the Invention

The present invention relates to a magnetic resonance image diagnostic apparatus fit for providing susceptibility-weighted images of the interior of, for example, the head, and also to a method of controlling the apparatus.

2. Description of the Related Art $T_2^*$-weighted images acquired by the gradient echo method acutely reflect the non-uniformity of a local magnetic field. Therefore, the gradient echo method is widely used as an imaging method for visualizing a difference between regions of interests in terms of susceptibility. In order to provide $T_2^*$-weighted images of the subject's head, rephasing is generally performed by means of gradient moment nulling (GMN), nullifying the influence that the blood flow imposes on the image quality. $T_2^*$-weighted images are thereby acquired. The longer the echo time, the more acutely any $T_2^*$-weighted image will reflect the difference in susceptibility. This is why the echo time is set relatively long in most cases to provide $T_2^*$-weighted images. An imaging method that is more sensitive to changes in susceptibility than $T_2^*$-weighted imaging is proposed in Magn Reson, Med. 52:612-618, 2004 (hereinafter referred to as the reference document). In this imaging method, it is possible to enhance both effects of amplitude reduction and phase difference induced by susceptibility effects because a phase-shift weighted mask is multiplied by amplitude images.

FIG. 14 is a diagram showing the pulse sequence in the three-dimensional (3D) gradient echo method that performs a first-order GMN in three axes, i.e., slice, phase encode and read-out. Assume that a phase shift occurs, due to a difference in susceptibility only, at the time an echo peak is observed. Then, the shift is proportional to the difference in susceptibility. If the phase change due to susceptibility is not taken into consideration, the phase shift of the spin, which results from the application of a gradient magnetic field, is given by the following equation (1) by using the period corresponding to the echo time TE as integration section.

$$-\gamma\left(r0\int G(t)dt + v0\int G(t)\cdot t\,dt + \frac{a0}{2}\int G(t)\cdot t^2 dt + \ldots\right) \quad (1)$$

where $\gamma$ is a gyromagnetic ratio of about $2\pi \times 42.6$ MHz/T. $G(t)$ is the gradient waveform vector, which corresponds to Gss, Gpe and Gro for the three axes (i.e., slice, phase encode and read-out), respectively, and $r0$, $v0$ and $a0$ are position, velocity and acceleration vectors of the spin at time t (t=0), respectively.

In equation (1), the respective terms indicate phase changes according to the position, velocity and acceleration, and correspond to the $0^{th}$-order, $1^{st}$-order and $2^{nd}$-order gradient moments. In equation (1), the third-order moment or any higher moment are not described. Nonetheless, the third-order moment and any higher-order moment contribute to the phase change, too.

GMN is a process that determines $G(t)$ so that any gradient moment up to a certain order may have the minimum value such as 0 for the echo time TE. GMN is therefore also called rephasing, too. In the phase encode or slice encode, however, the 0th moment changes every time an encode step is performed. Thus, in the GMN for the phase-encode axis, the 0th moment at the echo time TE is set to a specific value assigned to each encode step, and the first-order moment and any higher-order moment are set to a value as small as possible, such as 0. The zeroth-order GMN alone cannot achieve rephasing on the first-order moment and any higher-order moment in equation (1) for, for example, the blood flow that has active spins. Inevitably, the phases change as the object moves. Consequently, phase dispersion takes place, reducing the vector sum of the blood-flow spins, and the blood flow is therefore represented by a lower-level signal. Since the phase disperses in various ways in accordance with the velocity at which the blood flows, some blood flows may undergo insufficient phase dispersion and may not be represented by signals of sufficiently low level. In some cases, the blood flows will result in artifacts. Hence, in order to provide a $T_2^*$-weighted image of, for example, the head, which is free of influence of any fluid flow such as blood flow, the first-order GMN or any higher-order GMN must be performed. How high the order of GMN should be depends on whether $G(t)$ can be rephased within the echo time TE at that order. The higher the order of the rephasing, the more greatly the influence of the flow can be reduced.

The reference document proposes that a $T_2^*$-weighted image of the head, obtained by the gradient echo method of performing GMN of the first order in the three axes, be phase-weighted so that the image may be further susceptibility-weighted. This proposed method will be explained below.

The original amplitude image, which will be phase-weighted, is an image that reflects a difference in susceptibility because it is free of the influence of the blood flow, owing to the first-order GMN. In the phase data, the second-order moment and any higher-order moment is not rephased in equation (1). Nonetheless, the susceptibility is considered to dominantly control the phase shift of the spin since the phase shift is almost free of the influence of a flow such as the blood flow. The phase shift can therefore be regarded as representing the difference in susceptibility between different kinds of tissue. Thus, a phase mask image that lowers the signal value in proportion to the phase shift may be generated from the phase data and then repeatedly applied to the amplitude image several times. Then, an image further phase-shift-weighted in accordance with the susceptibility can be acquired. The image acquired by this method reflects the difference in susceptibility between different kinds of tissue in the form of a difference in contrast. In the head, the difference between the venous blood having a high deoxyhemoglobin concentration and the surrounding tissue having a high oxyhemoglobin concentration is large in terms of susceptibility. An image clearly visualizing the veins can therefore be provided if phase weighting is applied to the $T_2^*$-weighted image of the head. This method has been reported to be useful and effective if used in BOLD venography.

The technique disclosed in the reference document can indeed provide susceptibility-weighted images that visualize the veins more clearly than is possible before. However, these images do not visualize the arteries more clearly, because the arteries exhibit less non-uniformity of susceptibility than the veins. Inevitably, the effect of any flow cannot contribute to image contrast. With the technique disclosed in the reference document, the phase masking must be repeated a plurality of times in order to enhance the vein-visualizing ability as much as desired. If the phase masking is repeated, however, the phase difference between the veins and the surrounding tissue will be emphasized. Consequently, the vascular cavities of veins may be over-evaluated or the artifacts may be emphasized due to the susceptibility effect.

The technique disclosed in the reference document can certainly generate phase masks reflecting phase changes that dominate susceptibility only. However, second-order GMN or any higher-order GMN is not performed, and only first-order GMN is performed. Hence, the technique cannot prevent artifacts that develop from second-order moments and higher-order moments generated as the blood vessels undergo a pulsating motion or a complex motion.

BRIEF SUMMARY OF THE INVENTION

In view of the foregoing, it has been firstly desired that images should visualize, with high precision, the effect of flow or the effect of flow and susceptibility.

It has been secondly desired that the influence any flow imposes on the phase shift should be further reduced thereby to enhance the vein-visualizing ability.

According to a first aspect of the present invention, there is provided a magnetic resonance imaging diagnostic apparatus comprising: a generating unit which generates a slice gradient magnetic field, a phase-encode gradient magnetic field and a read-out gradient magnetic field that extend in a slice axis, a phase-encode axis and a read-out axis, respectively; a setting unit which sets a dephase amount for weighting a signal-level decrease resulting from flows in the arteries and veins present in a region of interest of a subject, with respect to at least one axis selected form the slice axis, phase-encode axis and read-out axis; and a control unit which controls the generating unit by using a pulse sequence for a gradient echo system, which includes a dephase gradient-magnetic-field pulse that corresponds to the dephase amount set by the setting unit for said at least one axis.

According to a second aspect of the present invention, there is provided a magnetic resonance imaging diagnostic apparatus comprising: a generating unit which generates a slice gradient magnetic field, a phase-encode gradient magnetic field and a read-out gradient magnetic field that extend in a slice axis, a phase-encode axis and a read-out axis, respectively; and a control unit which performs the first-order rephasing to the nth-order rephasing (n is 2 or a greater integer) on a spin with respect to at least one axis selected from the slice, phase-encode and read-out axes, and which controls the generating unit to achieve a pulse sequence for a gradient echo system in which an echo period is set to a value appropriate for canceling a phase shift of a vein present in a region of interest of a subject.

According to a third aspect of the present invention, there is provided a magnetic resonance imaging diagnostic apparatus comprising: a generating unit which generates a slice gradient magnetic field, a phase-encode gradient magnetic field and a read-out gradient magnetic field that extend in a slice axis, a phase-encode axis and a read-out axis, respectively; a setting unit which sets a dephase amount for weighting a signal-level decrease resulting from flows in the arteries and veins present in a region of interest of a subject, with respect to at least one axis selected form the slice, phase-encode and read-out axes; and a control unit which controls the generating unit by using a pulse sequence for an asymmetric spin-echo system, which includes a dephase gradient-magnetic-field pulse that corresponds to the dephase amount set by the setting unit for said at least one axis.

According to a fourth aspect of the present invention, there is provided a magnetic resonance imaging diagnostic apparatus comprising: a generating unit which generates a slice gradient magnetic field, a phase-encode gradient magnetic field and a read-out gradient magnetic field that extend in a slice axis, a phase-encode axis and a read-out axis, respectively; and a control unit which performs the 1st-order to the nth-order rephasing (n is 2 or a greater integer) on a spin with respect to at least one axis selected from the slice, phase-encode and read-out axes, and which controls the generating unit to achieve a pulse sequence for an asymmetric spin-echo system in which an echo period is set to a value appropriate for canceling a phase shift of a vein present in a region of interest of a subject.

According to a fifth aspect of the present invention, there is provided a method of controlling a magnetic resonance imaging diagnostic apparatus comprising a generating unit which generates a slice gradient magnetic field, a phase-encode gradient magnetic field and a read-out gradient magnetic field that extend in a slice axis, a phase-encode axis and a read-out axis, respectively, the method comprising: setting a dephase amount for weighting a signal-level decrease resulting from flows in the arteries and veins present in a region of interest of a subject, with respect to at least one axis selected form the slice, phase-encode and read-out axes; and controlling the generating unit by using a pulse sequence for a gradient echo system, which includes a dephase gradient-magnetic-field pulse that corresponds to the dephase amount set with respect to said at least one axis in the setting a dephase amount.

According to a sixth aspect of the present invention, there is provided a method of controlling a magnetic resonance imaging diagnostic apparatus comprising a generating unit which generates a slice gradient magnetic field, a phase-encode gradient magnetic field and a read-out gradient magnetic field that extend in a slice axis, a phase-encode axis and a read-out axis, respectively, the method comprising: performing the first-order rephasing to the nth-order rephasing (n is 2 or a greater integer) on a spin with respect to at least one axis selected from the slice, phase-encode and read-out axes, and which controls the generating unit and controlling the generating unit achieving a pulse sequence for a gradient echo system in which an echo period is set to a value appropriate for canceling a phase shift of a vein present in a region of interest of a subject.

According to a seventh aspect of the present invention, there is provided a method of controlling a magnetic resonance imaging diagnostic apparatus comprising a generating unit which generates a slice gradient magnetic field, a phase-encode gradient magnetic field and a read-out gradient magnetic field that extend in a slice axis, a phase-encode axis and a read-out axis, respectively, the method comprising: setting a dephase amount for weighting a signal-level decrease resulting from flows in the arteries and veins present in a region of interest of a subject, with respect to at least one axis selected form the slice axis, phase-encode axis and read-out axes; and controlling the generating unit by using a pulse sequence for an asymmetric spin-echo system, which includes a dephase gradient-magnetic-field pulse that corresponds to the dephase amount set with respect to said at least one axis in the setting a dephase amount.

According to an eighth aspect of the present invention, there is provided a method of controlling a magnetic resonance imaging diagnostic apparatus comprising a generating unit which generates a slice gradient magnetic field, a phase-encode gradient magnetic field and a read-out gradient magnetic field that extend in a slice axis, a phase-encode axis and a read-out axis, respectively, the method comprising: performing the first-order rephasing to the nth-order rephasing (n is 2 or a greater integer) on a spin with respect to at least one axis selected from the slice phase-encode axis, phase-encode axis and read-out axis, and controlling the generating unit achieving a pulse sequence for an asymmetric spin-echo system in which an echo period is set to a value appropriate for canceling a phase shift of a vein present in a region of interest of a subject.

According to a ninth aspect of the present invention, there is provided a magnetic resonance imaging diagnostic apparatus comprising: a collecting unit which collects magnetic resonance signals generated in a subject lying in a static magnetic field, when a radio-frequency pulse is applied, while applying a slice gradient magnetic field, a phase-encode gradient magnetic field and a read-out gradient magnetic field in a slice axis, a phase-encode axis and a read-out axis, respectively; and a main-scan control unit which controls the collecting unit by dephasing a spin about at least one axis selected from the slice, phase-encode and read-out axes, and by using a pulse sequence for a gradient echo system, while changing a dephase amount for the spin at least once during the collection of the magnetic resonance signals concerning an image.

According to a tenth aspect of the present invention, there is provided a method of controlling a magnetic resonance imaging diagnostic apparatus comprising a collecting unit which collects magnetic resonance signals generated in a subject lying in a static magnetic field, when a radio-frequency pulse is applied, while applying a slice gradient magnetic field, a phase-encode gradient magnetic field and a read-out gradient magnetic field in a slice axis, a phase-encode axis and a read-out axis, respectively; and a main-scan control unit which controls the collecting unit by dephasing a spin about at least one axis selected from the slice axis, phase-encode axis and read-out axis, and by using a pulse sequence for a gradient echo system, while changing a dephase amount for the spin at least once during the collection of the magnetic resonance signals concerning an image.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 1 is a diagram showing the configuration of a magnetic resonance imaging apparatus according to first to third embodiments of the present invention;

FIG. 4 is a diagram illustrating the difference between the rephasing sequence and the dephasing sequence, along with FIG. 5;

FIG. 5 is diagram illustrating the difference between the rephasing sequence and the dephasing sequence, along with FIG. 4;

FIGS. 6A to 6C are diagrams showing a minIP image acquired in the first embodiment and images acquired by the conventional methods;

FIG. 11 is a diagram showing an image acquired by the first embodiment;

FIG. 16 is a diagram showing another FSBB image;

FIG. 19 is a diagram illustrating how the intensity of the gradient magnetic field changes in each encode step in an embodiment of the invention;

FIG. 20 is a diagram illustrating how the b-factor changes in each encode step in an embodiment of the invention;

FIG. 21 is a diagram showing a pulse sequence applied in the main scan in an embodiment of the present invention;

FIG. 24 is a diagram showing an image of the head, which has been acquired by applying a fixed b-factor for the purpose of visualizing the penetrated branches present in the head;

FIG. 25 is diagram showing an image acquired by performing the phase contrast method;

FIG. 27 is a diagram explaining how the intensity of the gradient magnetic field should change in order to hold the b-factor unchanged.

DETAILED DESCRIPTION OF THE INVENTION

Figure 2:
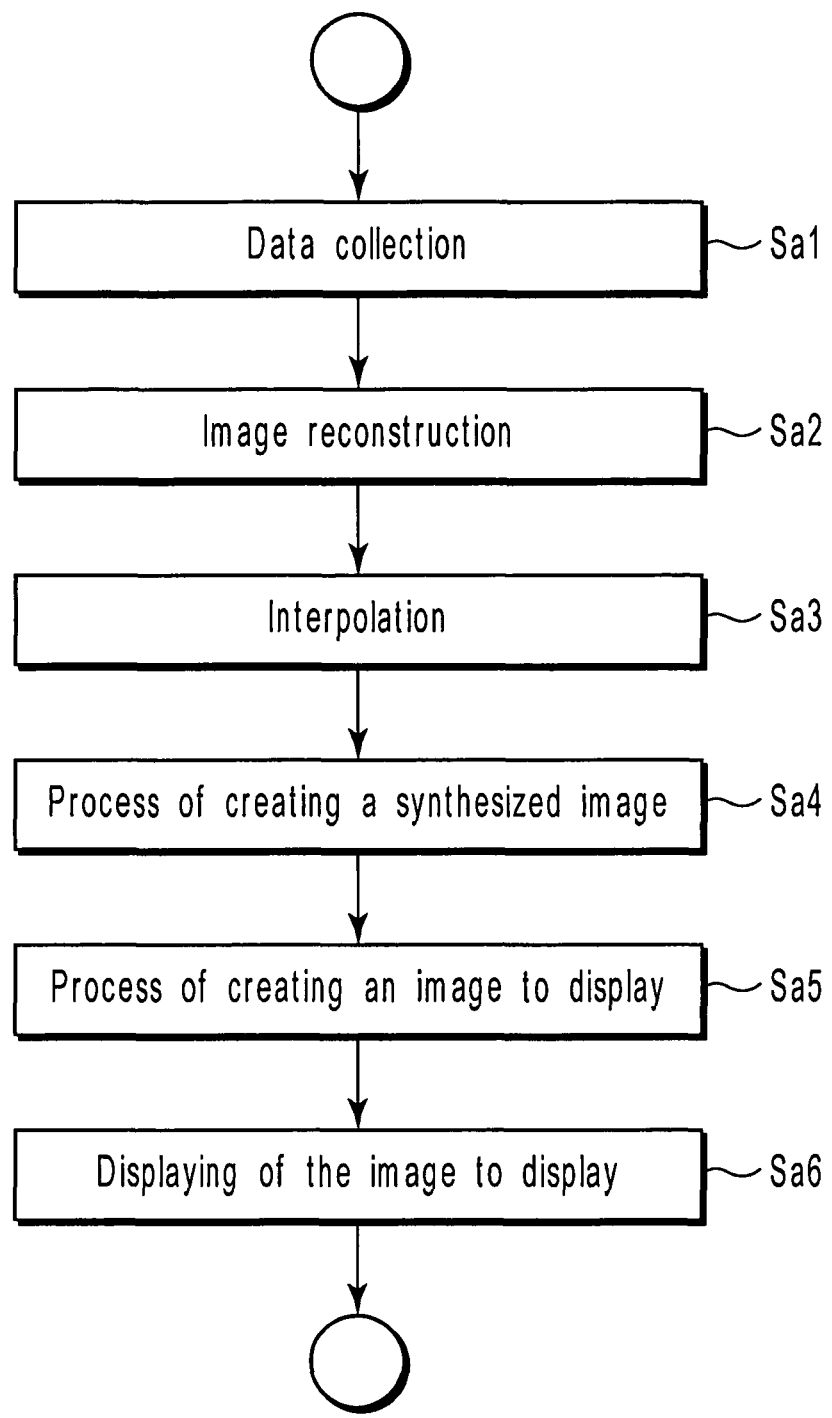
FIG. 2 is a flowchart explaining the sequence of processes performed in the first embodiment, by the host computer shown in FIG. 1.

First to third embodiments of the present invention will be described, with reference to the accompanying drawings.

FIG. 1 is a diagram showing the configuration of a magnetic resonance imaging apparatus 100 (hereinafter referred to as an MRI apparatus) according to first to third embodiments of this invention.

The MRI apparatus 100 comprises a bed unit, a static-magnetic-field generating unit, a gradient-magnetic-field generating unit, a receiving/transmitting unit, and a control/operating unit. A subject 200 may lie on the bed unit. The static-magnetic-field generating unit generates a static magnetic field. The gradient-magnetic-field generating unit is designed to add position information to the static magnetic field. The receiving/transmitting unit can receive and transmit a radio-frequency signal. The control/operating unit controls the other components of the system and reconstruct images. The MRI apparatus 100 has, as components of these units, a magnet 1, a static magnetic power supply 2, a shim coil 3, a shim power supply 4, a top plate 5, a gradient coil unit 6, a gradient power supply 7, an RF coil unit 8, a transmitter 9T, a receiver 9R, a sequencer (sequence controller) 10, an arithmetic unit 11, a storage unit 12, a display 13, an input device 14, an audio unit 15, and a host computer 16. To the MRI apparatus 100, an electrocardiograph unit is connected and detects an ECG signal representing the cardiac phase of the subject 200.

The static-magnetic-field generating unit includes the magnet 1 and the static magnetic power supply 2. The magnet 1 is, for example, a superconducting magnet or a normal magnet. The static magnetic power supply 2 supplies a current to the magnet 1. The static-magnetic-field generating unit therefore generates a static magnetic field $B_0$ in a cylindrical aperture (examination space) into which the subject 200 is moved. The direction of the static magnetic field $B_0$ virtually coincides with the axis (i.e., the Z-axis) of the examination space. The static-magnetic-field generating unit further includes the shim coil 3. The shim coil 3 generates a correction magnetic field for rendering the static magnetic field uniform when a current is supplied to it from the shim power supply 4 under the control of the host computer 16.

The bed unit moves the top plate 5, on which the subject 200 is lying, into or out of the examination space.

The gradient-magnetic-field generating unit includes the gradient coil unit 6 and the gradient power supply 7. The gradient coil unit 6 is arranged in the magnet 1. The gradient coil unit 6 has three coils 6x, 6y and 6z that can generate three gradient magnetic fields extending in mutually orthogonal X-, Y- and Z-axes, respectively. The gradient power supply 7 supplies pulse currents to the coils 6x, 6y and 6z, under the control of the sequencer 10. Supplied with the pulse current, the coils 6x, 6y and 6z generate gradient magnetic fields. The gradient-magnetic-field generating unit controls the pulse currents supplied from the gradient power supply 7 to the coils 6x, 6y and 6z. Thus, the gradient-magnetic-field generating unit synthesizes gradient magnetic fields extending in the three physical axes (i.e., the X-, Y- and Z-axes), respectively. The unit sets these magnetic fields in logical axes defined by a slice gradient magnetic field Gss, a phase-encode gradient magnetic field Gpe and a read-out (frequency-encode) gradient magnetic field Gro, respectively, which intersect at right angles with one another. The slice, phase-encode and read-out gradient magnetic fields, Gss, Gpe and Gro, are superposed on the static magnetic field $B_0$.

The receiving/transmitting unit includes the RF coil unit 8, the transmitter 9T, and the receiver 9R. The RF coil unit 8 is arranged near the subject 200 in the examination space. The transmitter 9T and the receiver 9R are connected to the RF coil unit 8. The transmitter 9T and the receiver 9R operate under the control of the sequencer 10. The transmitter 9T supplies an RF current pulse of Lamor frequency to the RF coil unit 8 in order to induce nuclear magnetic resonance (NMR). The receiver 9R acquires an MR signal (radio-frequency signal), such as an eco signal, which the RF coil unit 8 has received. The receiver 9R then performs, on the MR signal, various processes, such as pre-amplification, intermediate-frequency conversion, phase detecting, low-frequency amplification and filtering. Finally, the receiver 9R performs analog-to-digital (A/D) conversion on the MR signal, producing digital data (raw data).

The control/operating unit includes the sequencer 10, the arithmetic unit 11, the storage unit 12, the display 13, the input device 14, the audio unit 15 and the host computer 16.

The sequencer 10 has a CPU and a memory. The sequencer 10 receives pulse sequence information from the host computer 16. The pulse sequence information is stored into the memory. The CPU of the sequencer 10 controls the gradient power supply 7, transmitter 9T and receiver 9R in accordance with the sequence information stored in the memory. The CPU also receives the raw data output from the receiver 9R and transfers the raw data to the arithmetic unit 11. Note that the sequence information is all data necessary for operating the gradient power supply 7, transmitter 9T and receiver 9R in accordance with the pulse sequence. It includes, for example, information about the intensity of the pulse current supplied to the coils 6x, 6y and 6z, the period of supplying the pulse current and the timing of supplying the pulse current. The sequencer 10 has the function of controlling the gradient-magnetic-field generating unit under the control of the host computer 16, by using a pulse sequence for a gradient echo system, which contains a dephase gradient-magnetic-field pulse that corresponds to the dephase amount set by the host computer 16. Further, the sequencer 10 has the function of controlling the gradient-magnetic-field generating unit under the control of the host computer 16, causing the gradient-magnetic-field generating unit to generate magnetic resonance signals about the same slice, while changing the dephase amount.

The arithmetic unit 11 receives the raw data output from the transmitter 9T, through the sequencer 10. The arithmetic unit 11 has an internal memory. The internal memory has k-space (also known as Fourier space or frequency space), in which the raw data input to the arithmetic unit 11 is stored. The raw data is subjected to two- or three-dimensional Fourier transform, thereby reconstructing video data for the real space. The arithmetic unit 11 can perform, if necessary, synthesis and differential operation (including weighted differentiation) on any data representing an image. The synthesis includes cumulative addition of pixel values, maximum intensity projection (MIP), minimum intensity projection (minIP), and the like. As another example of the synthesis, the axes of several frames may be aligned in a Fourier space, and the raw data items representing these frames may be synthesized, thereby generating one-frame raw data. The addition of pixel values may be simple addition, arithmetic-mean process or weighted-mean process.

The storage unit 12 stores video data reconstructed or video data subjected to the above-mentioned synthesis or differential operation.

The display 13 can display various images to the operator, under the control of the host computer 16. The display 13 is, for example, a display device such as a liquid crystal display.

The input device 14 is operated to input various data items such as scanning conditions the operator desires, the pulse sequence, data about the image synthesis and differential operation, and the like. These data items are sent from the input device 14 to the host computer 16. The input device 14 comprises, as the case may be, a pointing device such as a mouse or a track ball, a section device such as a mode-switching panel, or a device such as keyboard.

The audio unit 15 generates messages for the start and end of breath holding as sounds under the control of the host computer 16.

The host computer 16 can perform various functions when a prescribed software routine is executed. One of these functions is to manage the units constituting the MRI apparatus 100 so that the apparatus 100 performs such various operations as the existing MRI apparatus performs. Another of the above-mentioned functions is to set a dephase amount so that the level decrease of a signal, due to the flows in the arteries and veins existing in the region of interest of the subject 200, may be weighted with respect to at least one of the slice, phase-encode and read-out axes. Still another of the above-mentioned functions is to control the sequencer 10 so that magnetic resonance signals may be collected by using a gradient-echo system pulse sequence that contains dephase gradient-magnetic-field pulses corresponding to a dephase amount with respect to the axis for which the dephase amount has been set. A further one of the above-mentioned functions is to determine a part for which the level decrease of a signal should be weighted. Another of the above-mentioned functions is to control the sequencer 10 so that a plurality of magnetic resonance signals about the same slice may be generated, while the dephase amount is being changed. Still another of the functions is to control the arithmetic unit 11 so that preparation images of a region of interest may be generated from a plurality of magnetic resonance signals. Another of the above-mentioned functions is to control the display 13, causing the display 15 to display a plurality of preparation images. A further one of the above-mentioned functions is to determine which one of preparation images the operator wants. Another of the above-mentioned functions is to reduce the phase shift determined from a magnetic resonance signal, by a value determined from the known susceptibility of the tissue, thereby to find the phase shift that corresponds to the flow of a tissue.

After performing a preparation work such as positioning scan, the host computer 16 performs imaging scan. The imaging scan is a scan for collecting a set of echo data items that are necessary for reconstructing an image. In this case, the imaging scan is the two-dimensional scan. The imaging scan can be carried out, along with the ECG gate method that uses ECG signals. In some cases, the ECG gate method need not be performed together with the imaging scan.

The electrocardiograph unit includes an ECG sensor 17 and an ECG unit 18. The ECG sensor 17 may be attached to the subject 200 to detect an ECG signal from the subject 200. The ECG signal is an electrical signal (hereinafter referred to as a sensor signal). The ECG unit 18 performs various processes, including binary encoding, on the sensor signal. The sensor signal thus processed is output to the sequencer 10. The electrocardiograph unit is, for example, a vector electrocardiograph. The sequencer 10 uses the sensor signal generated by the electrocardiograph unit, when it is necessary to carry out a scan in synchronism with the cardiac phase of the subject 200.

How the MRI apparatus 100 configured as described above operates will be explained in detail.

First Embodiment

The first embodiment will be described. The first embodiment is designed to achieve the first desire.

FIG. 2 is a flowchart explaining the sequence of processes the host computer 16 performs in the first embodiment to provide images.

In Step Sa1, the host computer 16 instructs the sequencer 10 to collect data. Upon receiving the instruction, the sequencer 10 collects data as will be explained below.

Figure 3:
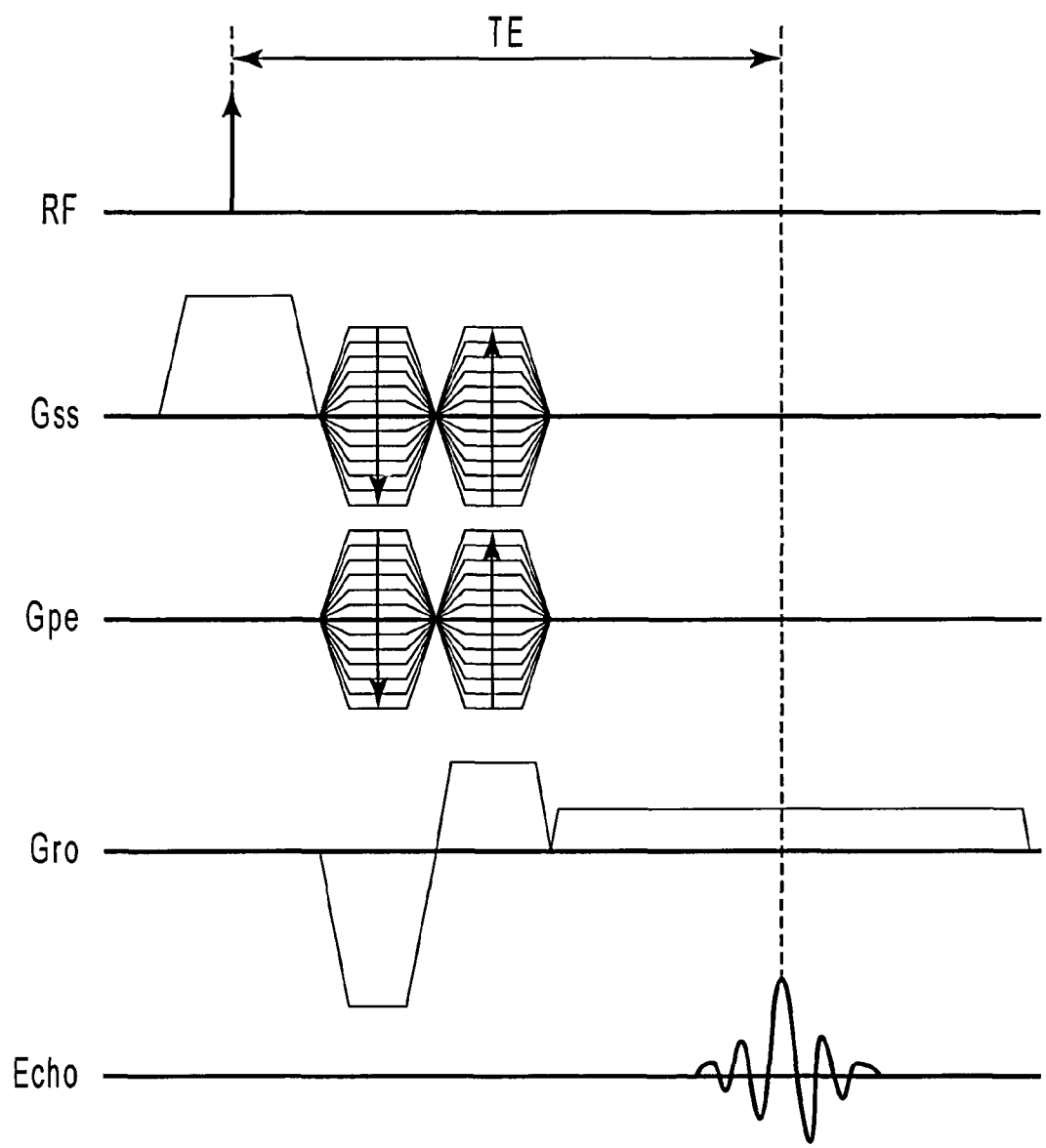
FIG. 3 is a diagram visualizing the pulse sequence in the first embodiment.

FIG. 3 is a diagram visualizing the pulse sequence in the first embodiment. FIG. 3 shows the waveform of a radio-frequency pulse (RF), the waveform of a gradient magnetic field (Gss), the waveform of another gradient magnetic field (Gpe), the waveform of a gradient magnetic field (Gro) and the waveform of an echo signal (Echo), in descending order. The pulse (RF) is applied to the object to be imaged. The wave (Gss) extends in the slice direction, the wave (Gpe) in the phase encode direction, and the wave (Gro) in the read-out direction.

Figure 14:
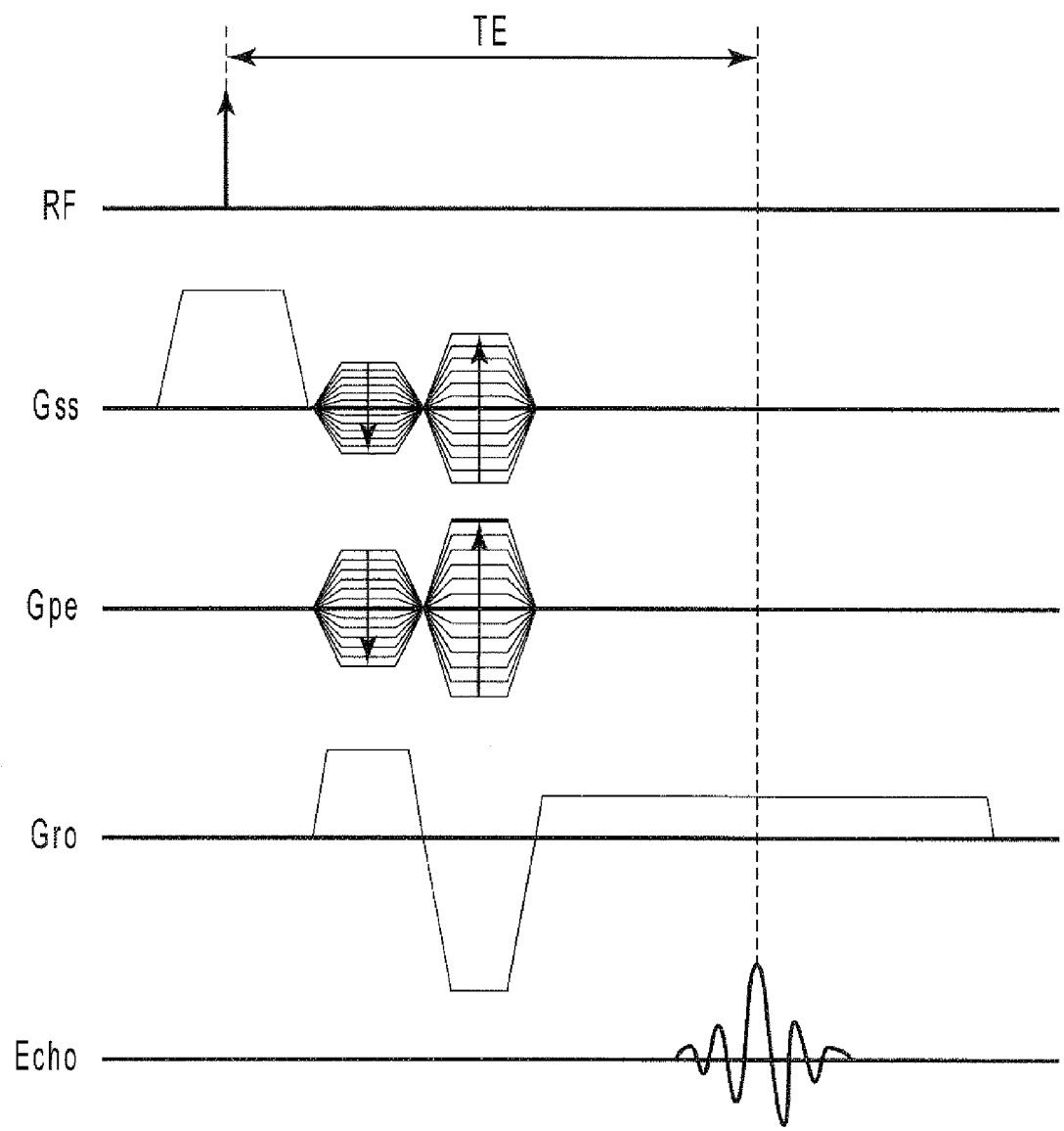
FIG. 14 is a diagram visualizing a pulse sequence generated in a the conventional method.

As seen from FIG. 3, the pulse sequence used in the first embodiment accords with the gradient echo method and is similar to the conventional pulse sequence shown in FIG. 14. However, dephasing is performed to provide a flow-weighted image in the first embodiment, whereas in the conventional pulse sequence, rephasing is performed, thus nullifying the influence of the flow and making only the susceptibility dominant, and then gradient echo method is performed to provide an image. That is, the gradient magnetic fields differ from those shown in FIG. 14, in order to achieve dephasing.

FIGS. 4 and 5 explain the difference between the rephasing sequence and the dephasing sequence. More precisely, these figures show the difference between the gradient waveform vector G(t) of rephasing and the gradient waveform vector G(t) of dephasing. For the sake of simplicity, either gradient waveform vector G(t) is illustrated as a rectangular wave form.

Assume that the time at which the RF pulse is applied is 0 and that the echo time TE is 3. Based on this assumption, gradient magnetic fields having intensities of 1, -2 and 1 are applied at time intervals of 1 as shown in FIG. 4, and gradient magnetic fields having intensities of −1 and 1 are applied at time intervals of 1.5 as shown in FIG. 5. In this case, both the zeroth-order moments, i.e., ∫G(t)dt, are 0. On the other hand, the first-order moment, i.e., ∫G(t)tdt, is 0 and the gradient waveform vector G(t) is a rephase in the case shown in FIG. 4. In the case shown in FIG. 5, the first-order moment is 2.25 and the gradient waveform vector G(t) is a dephase. Hence, in the case shown in FIG. 3, the rephasing and the dephasing differ in terms of the intensities of those parts of the gradient magnetic fields Gss, Gpe and Gro, which are simultaneously applied. Note that the gradient magnetic fields Gss, Gpe and Gro are indicated as trapezoidal waves. The first trapezoidal wave of the magnetic field Gss and the last trapezoidal wave of the magnetic field Gro, whose values are determined by the imaging conditions, are not applied at the same time.

The rephasing controls the gradient magnetic fields to cancel out the change in the signal, which occurs due to the influence of the flow. If rephased, the phase change of the blood flow is reduced significantly. Thus, the blood-flow signal is collected as a high-level signal, not decreased in level. Conversely, the dephasing causes the influence of the flow to induce changes in the signal. In the dephasing, the gradient magnetic fields promote the phase dispersion of the spin of a flow, such as the blood flow, which is a motion. The vector sum of the blood-flow spins is small in the dephasing. In other words, the amplitude component of the flow signal is greatly attenuated. The flow signal is therefore is suppressed and eventually collected as a low-level signal.

FIG. 3 shows a pulse sequence that lasts for only a period equivalent to one echo time, 1TE. The spin warp method, the echo planar imaging method, the echo-shifted method and the multi-echo method, all based on the pulse sequence of FIG. 3, can be utilized. In the spin warp method, RF excitation and echo-signal collection are repeated, for the repeating period TR that is longer than the echo time TE. In the echo planar imaging method, echo signals are collected for a plurality of lines in the k-space, every time the RF excitation is performed once in the repeating period TR. In the echo-shifted method, the RF excitation and the process of collecting echo signals are repeated in each repeating period TR that is shorter than the echo time TE. That is, the echo signals generated during the RE excitation performed in a certain repeating period TR are collected not in the same period, but in the next period. In the multi-echo method, the RF excitation is carried out once in the repeating period TR, and echo signals are collected for lines in the k-space, which pertain to a plurality of images, with respect to the RF excitation carried out once.

In Step Sa2, the host computer 16 instructs the arithmetic unit 11 to reconstruct an image from the data collected as described above. Upon receiving this instruction, the arithmetic unit 11 performs, for example, a known image-reconstructing method. This image-reconstructing method obtains an amplitude image, a phase image and three-dimensional (3D) volume data.

In Step Sa3, the host computer 16 instructs the arithmetic unit 11 to perform interpolation on the image reconstructed as described above. On receiving the instruction, the arithmetic unit 11 performs the known interpolation process. The interpolation process may not be carried out.

In Step Sa4, the host computer 16 instructs the arithmetic unit 11 to create a synthesized image. Upon receiving this instruction, the arithmetic unit 11 creates a synthesized image from the amplitude image and the phase image. The arithmetic unit 11 creates, for example, a phase mask image that represents a part greatly phase-shifted and a part slightly phase-shifted. The phase mask image consists of zero-pixels defining a part of the image, which advances (or is delayed) in phase, and one-pixels defining the other part of the image, which has no phase difference. That is, the phase mask image represents a part of high susceptibility (having a phase difference) and a part of low susceptibility. The phase mask image is a phase image that may be filtered so that the low-frequency component may become free of phase disturbance. The filtering may be accomplished by a process of passing the phase image through a high-pass filter or a process of differentiating the phase image before and after passing the phase image through a low-pass filter. The arithmetic unit 11 multiplies the phase image thus obtained, by the amplitude image, a predetermined number of times (one to several times), thus providing an SWI image in which the phase change due to the susceptibility is further weighted. This multiplication may not be carried out.

In Step Sa5, the host computer 16 instructs the arithmetic unit 11 to create an image to display. Upon receiving this instruction, the arithmetic unit 11 creates an image to display, by the known method. This process creates data that represents the blood vessel as a continuous tube. The process may be a projection such as maximum intensity projection (MIP), minimum intensity projection (minIP), or integral projection. In the first embodiment, both the arteries and the veins are represented by signals that are lower in level than those representing the surrounding tissue. In view of this, minimum intensity projection (minIP) is optimal. The data representing the surface of any blood vessel may be extracted in order to apply volume rendering or surface rendering. Alternatively, multi-planar reconstruction (MPR) may be employed to enable the doctor to observe the original image signal.

In Step Sa6, the host computer 16 causes the display 13 to display the image created in step Sa5, amplitude image or phase image, in accordance with the operator's instruction.

Figure 6B:
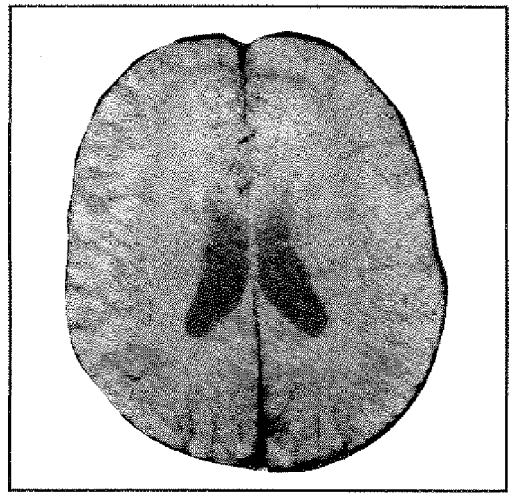
Figure 6C:
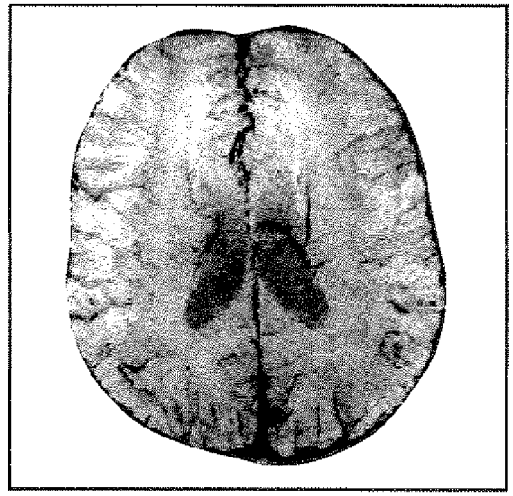
Figure 7A:
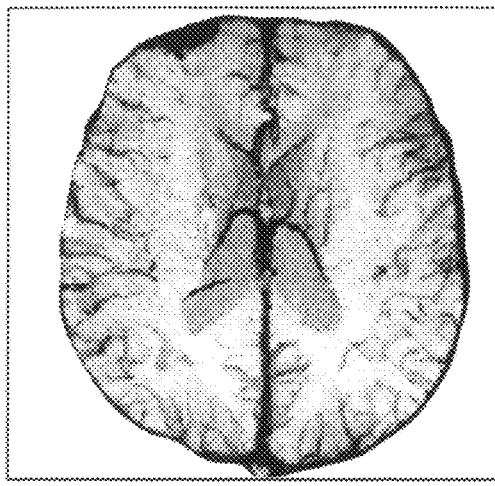
FIGS. 7A to 7F are diagrams showing some minIP images generated by changing b-factor in the first embodiment.
Figure 7B:
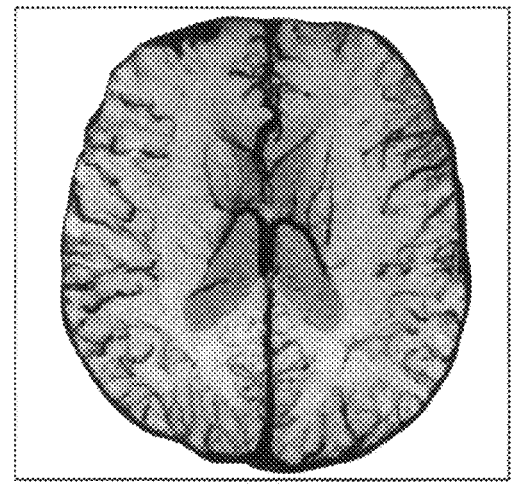
Figure 7C:
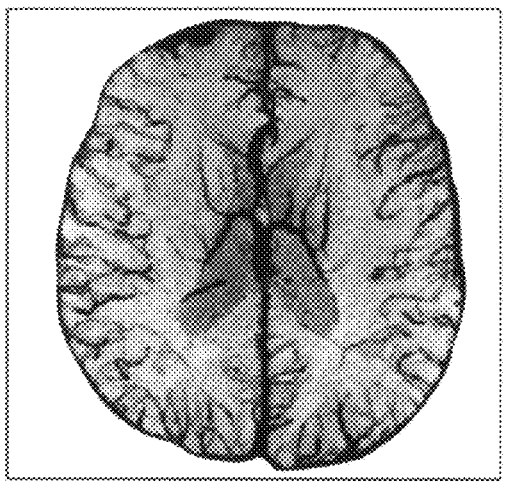
Figure 7D:
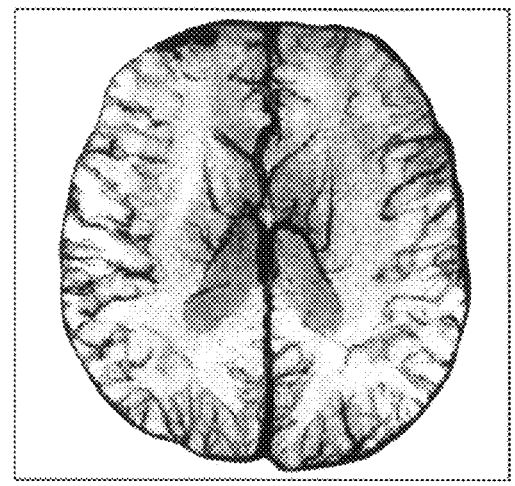
Figure 7E:
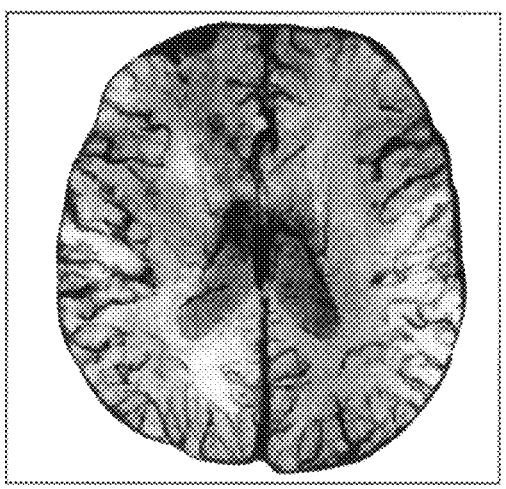
Figure 7F:
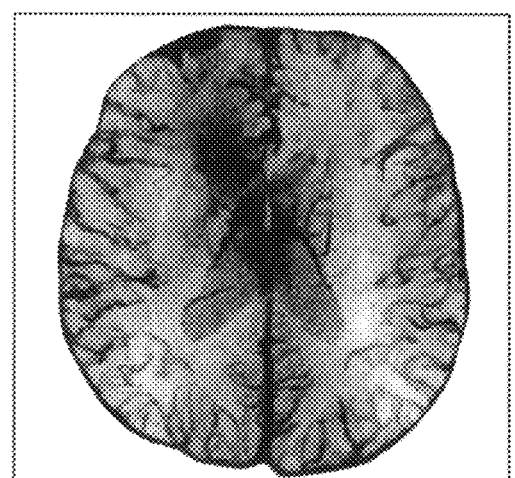

FIG. 6A is a diagram showing an image to display, which has been created by minIP performed in Step Sa5, by not carrying out phase-weighting in Step Sa4. FIG. 6B is a diagram showing an image acquired by the first conventional method (see the reference document), in which the gradient echo method including rephasing is performed to accomplish imaging. FIG. 6C is a diagram showing an image acquired by the second conventional method, in which the phase-weighting is performed on the image obtained in the first conventional method. As can be understood from FIGS. 6A to 6C, the image of FIG. 6B, which has been acquired by the first conventional method, visualizes the blood vessels, but is very unclear. The image of 6C, which has been acquired by the second conventional method, indeed visualizes the veins more clearly than the image acquired by the first conventional method. However, the image of 6C does not visualize the arteries (which undergo no phase shift) so clearly yet. Further, in the image of FIG. 6C, the signal-to-noise ratio pertaining to the cerebral parenchyma has decreased because the phase-weighting has been repeated. By contrast, the image of FIG. 6A, which has been acquired by the first embodiment of this invention, visualizes both the veins and the arteries clearly and accurately, though no phase-weighting has been performed to provide the image. In other words, this image visualizes the blood vessels more clearly. In addition, the cerebral parenchyma is visualized with a high signal-to-noise ratio, too, since no post-process such as a masking process is carried out.

Thus, in the first embodiment, flow can be visualized accurately, without over-evaluating the vascular cavities of veins or weighting artifacts resulting from the effects of susceptibility.

In the first embodiment, artifacts may develop, depending on the dephase amount. The dephase amount should therefore be adjusted to such an appropriate value as would not cause artifacts and also would weight the image of blood vessels.

The dephase amount can be defined by the offset amount of the moment referred to in conjunction with FIGS. 4 and 5. Alternatively, the dephase amount may be defined by the above-mentioned b-factor. The offset amount of the moment and the b-factor differ in concept from each other. They cannot be simply converted in unit, one to the other. Nevertheless, the adjustment of the dephase amount is essentially the same, whether it is discussed in terms of the offset amount of the moment or the b-factor. Therefore, the dephase amount will be explained hereinafter, in terms of the b-factor. Note that the offset amount of the moment is explained in the description concerning FIGS. 4 and 5, because the rephasing and the dephasing can be well compared in the same unit.

The b-factor is defined as inner product of the integration of the waveform vectors of gradient magnetic fields, as in the following equations (2) and (3).

$$b = (2\pi)^2 \int_0^{TE} k(t) \cdot k(t) dt \quad (2)$$

$$k(t) = \frac{\gamma}{2\pi} \int_0^t G(t') dt' \quad (3)$$

The b-factor represents a decrease in the signal level, which has resulted from dephasing. It is therefore related to the dephase amount. A coefficient D is applied to a particular tissue, and the signal level is said to fall in accordance with the b-factor as expressed by the equation $S(b)=S(0)\cdot\exp(-bD)$, where $S(0)$ is the signal not dephased yet and $S(b)$ is the signal dephased.

FIGS. 7A to 7F are diagrams showing some minIP images generated as described above, by changing the b-factor. The b-factors applied to acquire the images of FIGS. 7A to 7F are 0.1, 1, 4, 16, 32 and 64 sec/mm$^2$, respectively.

As seen from FIGS. 7A to 7F, the veins and the arteries are visualized, whichever b-factor ranging from 0.1 to 64 sec/mm$^2$ has been applied. However, as the comparison of the images of FIGS. 7E and 7F clearly indicates, large artifacts develop in the image when the b-factor is 64 sec/mm$^2$. In view of this, the b-factor should better be set within the range of 0.1 to about 50 sec/mm$^2$. Moreover, as the comparison of the images of FIGS. 7A and 7B clearly teaches, the blood vessels are imaged but a little unclear when the b-factor is 0.1 sec/mm$^2$. Further, as the comparison of the images of FIGS. 7D and 7E clearly shows, the signal-to-noise ratio of the cerebral parenchyma is somewhat low when the b-factor is 32 sec/mm$^2$. Hence, the b-factor should still better be within the range of 1 to 20 sec/mm$^2$.

The relation between the dephase amount and the ability of visualizing the blood vessels differs, from subject to subject. The host computer 16 therefore has the function of setting the dephase amount to a value desirable for the subject 200. The host computer 16 may set a dephase amount in accordance with the specific value the operator has input by operating the input device 14. Instead, it may set the dephase amount by selecting one of the several dephase-amount data items (i.e., a plurality of candidates). Otherwise, the computer 16 may automatically set an appropriate dephase amount.

The value the operator input to set the dephase amount is, for example, the b-factor, velocity encoding (VENC), or the velocity. To help the operator to determine which value should be input, preparation images may be displayed on the display 13. For example, the b-factor is changed several times, thus performing imaging the object several times and providing several images thereof, and these images may then be displayed on the display 13. More specifically, such images as shown in FIGS. 7A to 7F may be displayed. Alternatively, the VENC may be changed, acquiring a plurality of magnetic resonance angiographs (MRAs) by performing the phase contrast method, and the MRAs are may be displayed. These images may be displayed, together with the b-factors or the VENC, both used to acquire images of desired quality. Then, the operator can regard the b-factor or the VENC as values that should be set next time in order to obtain images of desired quality. Still alternatively, the host computer 16 may receive data designating any image the operator has selected and may then input the b-factor or VENC that has been used to acquire the image selected by the operator. Furthermore, the information describing the dephase amount appropriate for weighting the signal-level decrease at each part of the image may be stored into, for example, the storage unit 12. In this case, the host computer 16 can set a dephase amount fit for the part the operator has designated, on the basis of the information stored in the storage unit 12.

To set the an appropriate dephase amount automatically, the host computer 16 may select an image having a contrast-to-noise ratio (CNR) or a signal-to-noise ratio (SNR) that falls within a tolerance range, from the preparation images obtained as described above. Then, the host computer 16 may set a dephase amount on the basis of the b-factor or the VENC used to acquire the preparation image thus selected. There may be several preparation images that accord with the conditions described above. If this is the case, the host computer 16 may select any one of the preparation images. However, the greater the dephase amount is, the higher the ability of visualizing the blood vessels will be. It should therefore be better for the host computer 16 to select an image acquired by using a large b-factor or a small VENC.

In the first embodiment, the ability of visualizing the flow never changes in accordance with the echo time TE. Thus, TE can be changed as is desired.

The echo time TE is related to the influence the non-uniformity of a local magnetic field imposes on the image contrast. That is, the shorter the echo time TE, the less the non-uniformity of the local magnetic field will influence the image contrast. Hence, TE may be set to such a small value as would not reflect the non-uniformity of the local magnetic field on the image contrast. Then, an image can be acquired, in which the effect of flow is dominant. Conversely, the TE may be set to such a large value as would reflect the non-uniformity of the local magnetic field on the image contrast. In this case, an image can be acquired, which reflects both the effect of flow and the effect of susceptibility.

Figure 8:
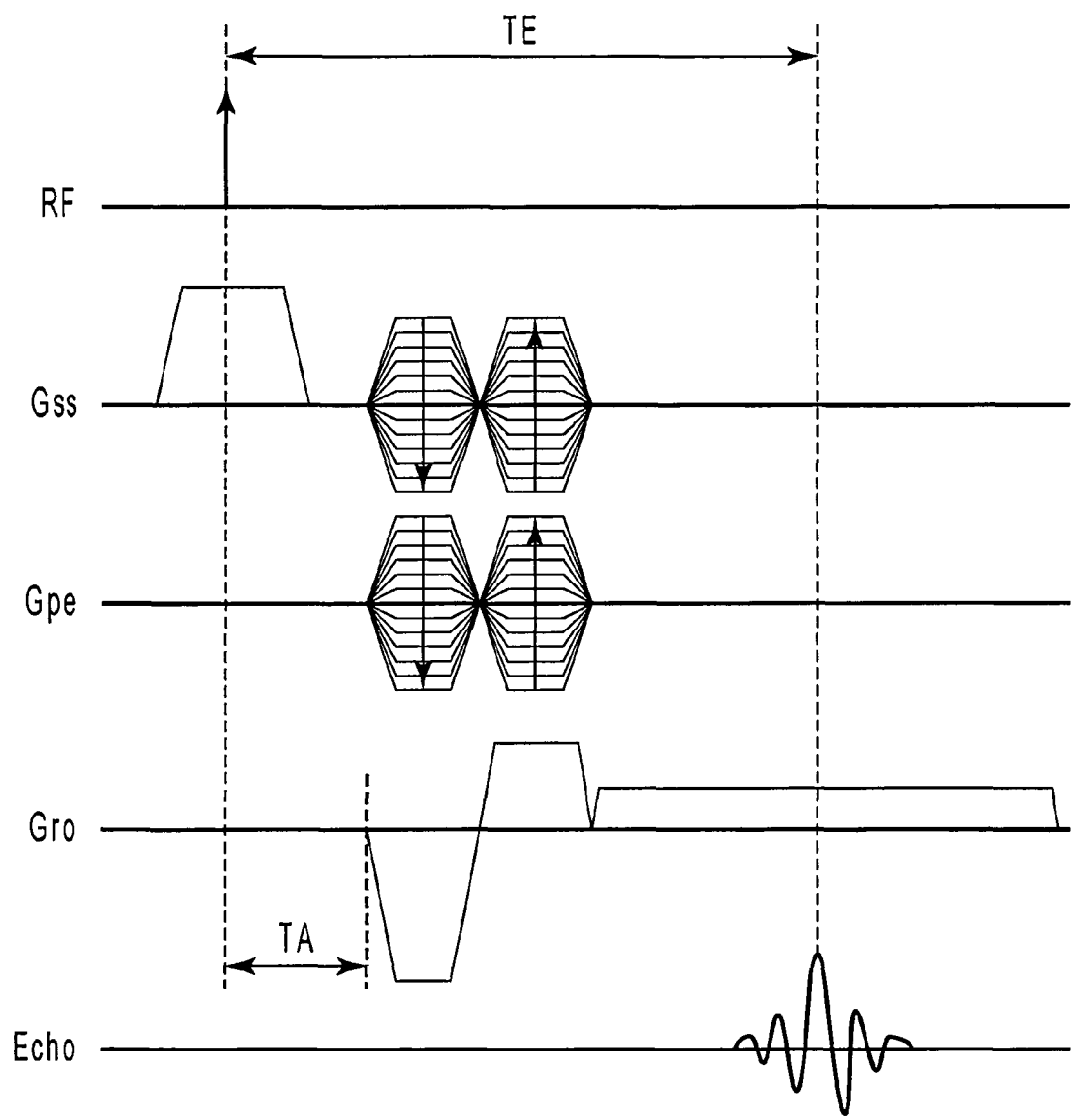
FIG. 8 is a diagram explaining a method of adjusting the echo time.

The echo time TE is a period that extends from the RF excitation to the appearance of a peak in the echo signal. The peak appears in the echo signal when the integral value of the gradient magnetic field Gro decreases to zero. The echo time TE can therefore be adjusted by changing the time TA at which the gradient magnetic field Gro is applied after the RF excitation without changing the pattern of the gradient magnetic field Gro, as is shown in FIG. 8. The echo time TE can of course be adjusted by changing the pattern of the gradient magnetic field Gro or by changing both the time TA and the pattern of the gradient magnetic field Gro.

An image acquired in a relatively short echo time TE, i.e., an image in which the effect of the flow is dominant, images the blood vessels accurately and clearly. Such the image helps a doctor to examine the blood vessels. In the first embodiment, the attenuation or phase change of the signal is used to visualize the flow. The image acquired can clearly visualizes the thin arteries and the collateral channels extending around from above and can therefore clinically useful in diagnosing, for example, cerebral infarction.

Cerebral infarction can be cured if a thrombus-dissolving chemical is applied within a few hours of the development of the infarction, particularly if the infarction is acute. If the patient is left untreated, the cerebral tissue will undergo necrosis over time. Treatment must therefore be started before the affected cerebral tissue become irreversibly damaged. The scan time can be shortened by reducing the number of phase encodes, namely by lowering the resolution.

However, thrombi, for example, must be imaged at a sufficiently high signal-to-noise ratio or a high spatial resolution and within a very short scan time, in order to attain reliable diagnosis.

Therefore, the RF coil unit 8 shown in FIG. 1 is a multi-array coil that has a plurality of coil elements and the parallel imaging (PI) method is employed in the first embodiment. The imaging time can be thereby shortened without reducing the resolution. This is very useful in the diagnosis of cerebral infarction.

In principal, the signal-to-noise ratio decreases in the PI method, in inverse proportion to the increase rate of imaging speed. Nonetheless, the PI method should rather be used to shorten the time, while maintaining the spatial resolution, since 3D images have a higher signal-to-noise ratio than 2D images.

The PI method is a technique of omitting the phase encode step and performing another step instead, thereby generating an image folded from the incomplete raw data and reconstructing an image from the raw data. As is known in the art, the PI method is classified into sensitivity encoding (SENSE) and simultaneous acquisition spatial harmonics (SMASH), which differ in terms of image-reconstructing process. Either type of PI method can be utilized in this embodiment. SENSE develops the folded part extending out of the field of view (FOV), by using the sensitivity distribution of the coil elements. SMASH first generates complete raw data from the raw data the coil elements, by using the sensitivity distribution of the coil elements, and then reconstructs an image from the complete raw data.

If the PI method (particularly, SENSE) is employed, phase data items will be acquired for the coil elements, respectively. The phase data items thus acquired are synthesized by means of, for example, weighted addition, providing synthesized data. From the synthesized data a phase mask image is formed for use in the phase-shift weighting that is performed in Step Sa4. Thus, an effective phase-shift weighting can be accomplished in the PI method, too.

The phase change resulting from the effect of susceptibility is influenced not only by the echo time TE, but also by the intensity of the static magnetic field. The value appropriate for the echo time TE in the first embodiment therefore changes in accordance with the intensity of the static magnetic field. The echo time TE may be set to about 40 ms at 1.5T, and to about 20 ms at 3T. Then, the blood vessels become flow-void because of the phase dispersion that has resulted from dephasing. As a result, an image will be obtained, which has a contrast fully reflecting the effect of susceptibility will be obtained. To induce a positive phase dispersion by means of dephasing, thereby to lower the level of the signal, a $T_2^*$-weighted image can be acquired within a short TE. This shortens the imaging time and increases the signal-to-noise ratio in the acquisition of $T_2^*$-weighted image.

A $T_2^*$-weighted image, in which the blood-flow spin induces a low-level signal because of the phase dispersion, can certainly be acquired by performing GMN involving the zeroth-order moment only, without performing rephasing using the first-order moment or any higher-order moment as in the conventional method. However, GMN using the zeroth-order moment only cannot achieve a sufficient phase dispersion of the blood flow. Consequently, the resultant image of the blood vessel consists of low-level signal components and high-level signal components where the phase dispersion is insufficient. Inevitably, the blood vessel cannot be less well visualized than is possible with the first embodiment of the present invention.

An image acquired by using a relatively long echo time TE, i.e., image formed by virtue of the effect of flow and the effect of susceptibility, provides information about thrombi and bleeding, thanks to the effect of susceptibility, in addition to the information about the blood vessels. This image therefore enables the doctor not only to determine whether thrombi exist or bleeding is occurring, but also to locate the thrombi or the bleeding. That is, the image gives the doctor information that is useful in planning an effective treatment.

In the conventional method, too, wherein rephasing is carried out, the longer the echo time TE, the more greatly the non-uniformity of the local magnetic field will be emphasized. The phase dispersion is therefore large in the will increase in any $T_2^*$-weighted image acquired for a long echo time TE. Hence, the $T_2^*$-weighted image has high ability of visualizing the blood vessels indeed. However, not only the blood flow, but also the parenchyma is susceptibility-weighted. As a consequence, the unevenness or distortion will be conspicuous in the image, due to the non-uniformity of the local magnetic field, or the signal-to-noise ratio will decrease or the imaging time will increase, because of the long echo time TE.

The conventional gradient echo method can indeed provide a $T_2^*$-weighted images that clearly visualizes an event, such as bleeding, which accompanies a large change of susceptibility. If rephasing is effected, nullifying the influence of the blood flow, the blood flow will generate a high-level signal. As a result, the image contrast is not so high that the cerebral parenchyma and that of the blood vessels cannot be well distinguished. In other words, the bleeding site and the position of any blood vessel cannot be clearly confirmed in the same image.

The phase-shift data acquired from an echo in the first embodiment represents a phase shift that has developed due to susceptibility and a flow. Unless the phase-shift data is appropriately processed, it cannot show how high the susceptibility is or how fast the flow is. Nevertheless, phase-shift data in which only the flow is dominant can be obtained by subtracting the phase shift specific to the susceptibility of the tissue from the phase shift due to the flow. In this regard, it should be noted that the susceptibilities of various kinds of tissue are known.

The image acquired in the first embodiment described above is a magnetic resonance angiograph (MRA) that can be obtained without the necessity of using any contrast medium. That is, the first embodiment can provide such a useful image as described above, without applying a contrast medium. Good use can therefore be made of non-invasiveness that is an advantageous feature of magnetic resonance imaging.

Figure 9:
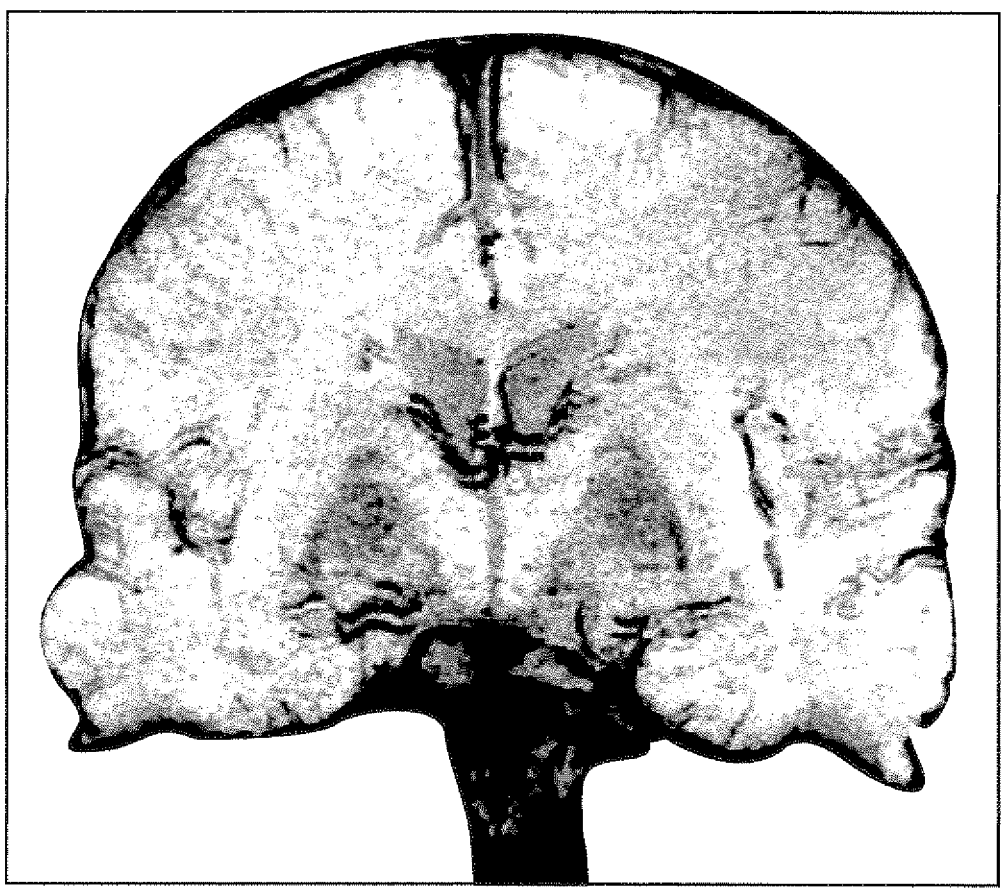
FIG. 9 is a diagram showing an image generated by performing minIP in the conventional SWI, for a cross section perpendicular to the direction of a stationary magnetic field.
Figure 10:
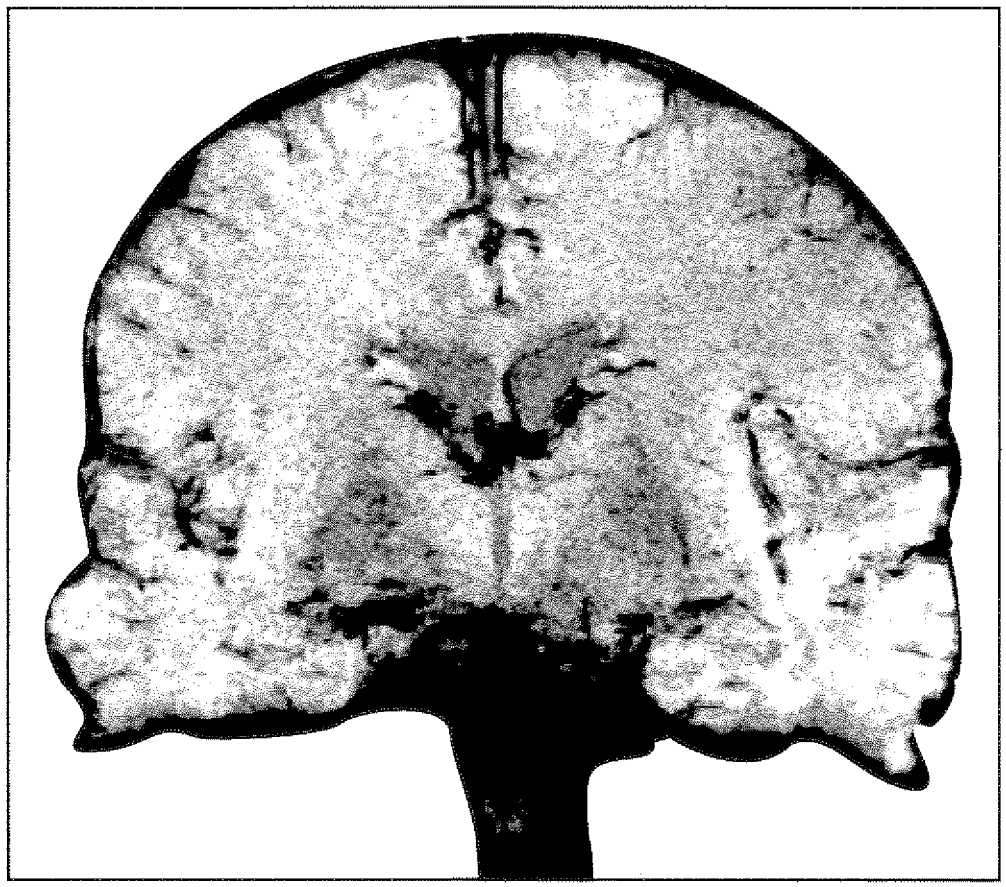
FIG. 10 is a diagram showing an image generated by performing minIP on an image acquired by phase-shift weighting that neglects the polarity in the conventional SWI, for a cross section perpendicular to the direction a stationary magnetic field.

As is known in the art, in such susceptibility-weighted imaging (SWI) as disclosed in the reference document, the phase polarities inside and outside any blood vessel may change due to the magic angle effect, depending on the angle between the direction in which the static magnetic field extends and the direction in which the blood vessel runs. Inevitably, in the conventional SWI, any part adjacent to a vein is represented by a low-level signal when minIP is performed. In this case, one vein will appear as two parallel veins as is illustrated in FIG. 9. If phase-shift weighting is performed, neglecting the polarities of the signals, the signal emanating from inside the blood vessel and the signal emanating from outside the blood vessel will have a low level. Thus, as shown in FIG. 10, the vascular cavity of the vein looks thicker than it is. This would not happen with an image acquired by the first embodiment of this invention. As seen from FIG. 11, the vein is accurately visualized. That is, the first embodiment can provide an image that clearly and accurately visualizes the vascular cavity even if it is an image projected in a cross section perpendicular to the static magnetic field, representative example of which are the coronal plane and the sagittal plane.

Second Embodiment

The second embodiment will be described. The second embodiment is designed to achieve the second desire.

Figure 12:
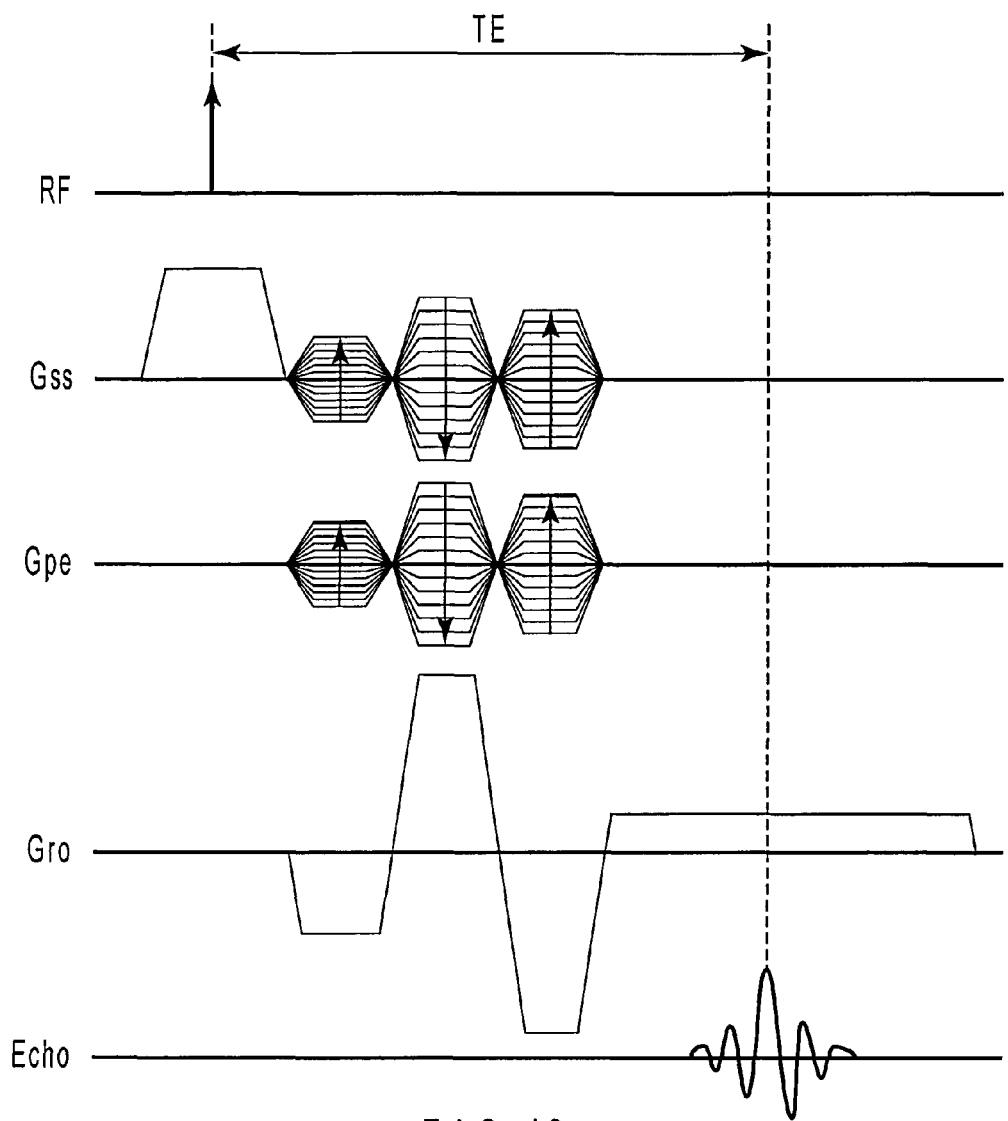
FIG. 12 is a diagram visualizing the pulse sequence in the second embodiment.

FIG. 12 is a diagram visualizing the pulse sequence in the second embodiment. More precisely, this figure shows the waveform of a radio-frequency pulse (RF), the waveform of a gradient magnetic wave (Gss), the waveform of another gradient magnetic wave (Gpe), the waveform of a gradient magnetic wave (Gro) and the waveform of an echo signal (Echo), in descending order. The pulse (RF), gradient magnetic waves (Gss, Gpe and Gro) and echo signal (Echo) are applied to the object to be imaged. The wave (Gss) extends in the slice direction, the wave (Gpe) in the phase encode direction, and the wave (Gro) in the read-out direction.

As seen from FIG. 12, the pulse sequence used in the second embodiment accords with the gradient echo method.

The second embodiment differs from the first embodiment in that rephasing is performed for the echo time as disclosed in the reference document. However, a gradient magnetic field is applied to reduce both the first-order moment and the second-order moment to zero, while only the first-order moment is reduced to zero in the method of the reference document. The echo time TE is long enough to cancel the phase shift at any vein.

Thus, in the second embodiment, only the susceptibility is dominant with respect to phase changes and phase data can enhance the ability of visualizing the veins.

The first-order moment and the second-order moment need not be strictly zero. Rather, it suffices for the first-order moment to have such a value as will cancel the amplitude attenuation or phase shift resulting from the flow.

Third Embodiment

The imaging method used in the magnetic resonance imaging diagnostic apparatus 100 according to the first embodiment, i.e., the imaging method using a pulse sequence for the gradient echo system, which includes a dephase gradient-magnetic-field pulse, will be hereinafter referred to as flow-sensitive black blood (FSBB) imaging.

In the FSBB imaging, the phase of each flow such as a blood flow, which is a motion, is gradually distributed, and the vector sum of the flow spins gradually decreases. That is, the amplitude component of the flow signal is gradually attenuated. As a result, the signal of the flow is suppressed and an image will be obtained, in which any blood vessel is represented by a low-level signal. Generally, a b-factor is used, which indicates a dephase amount. The b-factor is a tensor amount defined by equations (2) and (3) above.

In equation (3), $\gamma$ is a gyromagnetic ratio of about $2\pi \times 42.6$ MHz/T, and G(t) is a gradient-magnetic-field waveform vector. G(t) corresponds to Gss, Gpe and Gro for the axes of slice, phase encode and read-out, respectively. The b-factor indicates a signal-level decrease and defines a relation between signals, i.e., $S(b)=S(0) \cdot \exp(-bD)$, where S(0) is a signal not dephased, S(b) is a signal dephased, and D is a coefficient for a specific tissue. When signals have this relation, the signal level may decrease in accordance with the b-factor.

Figure 15:
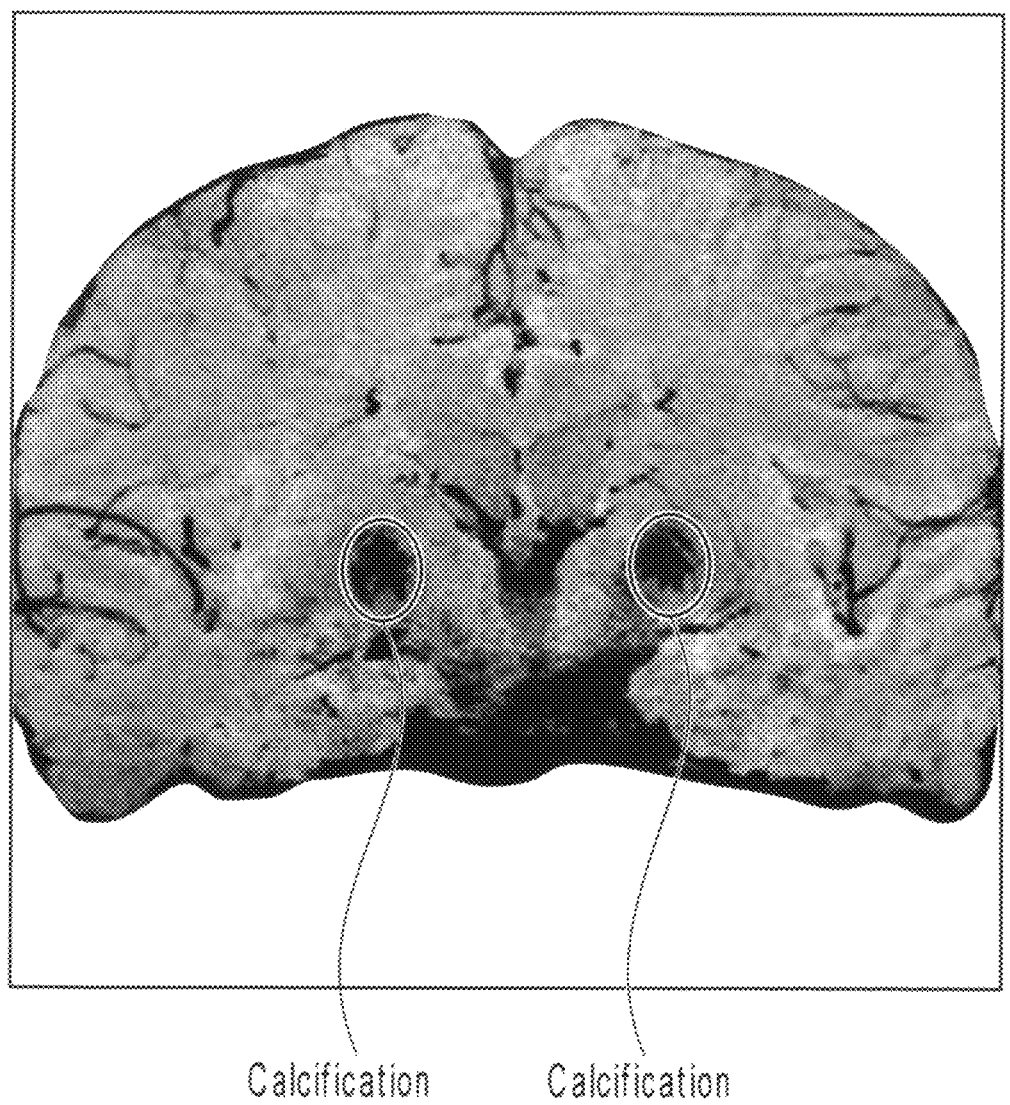
FIG. 15 is a diagram showing an FSBB image.

In the FSBB imaging, a calcification in the brain is represented by a low-level signal. Hence, if the FSBB imaging is applied to image thin blood vessels, such as penetrated branches, the images of the calcifications in the brain will overlap the images of the blood vessels. In this case, the blood vessels may not be clearly detected in the MRI image. This influence of calcification can be minimized by, as is known in the art, reducing the echo time TE. FIGS. 15 and 16 show FSBB images acquired when echo time TE is 40 ms and 20 ms, respectively. The image of FIG. 15 more clearly visualizes calcifications than that of FIG. 16.

In the FSBB imaging, a dephase amount equal to or greater than a specific value must be applied in order to image blood vessels sufficiently. To preserve such a dephase amount, however, the gradient magnetic field must be intensified in inverse proportion to the echo time TE. Therefore, echo time TE cannot be shortened too much.

Figure 26:
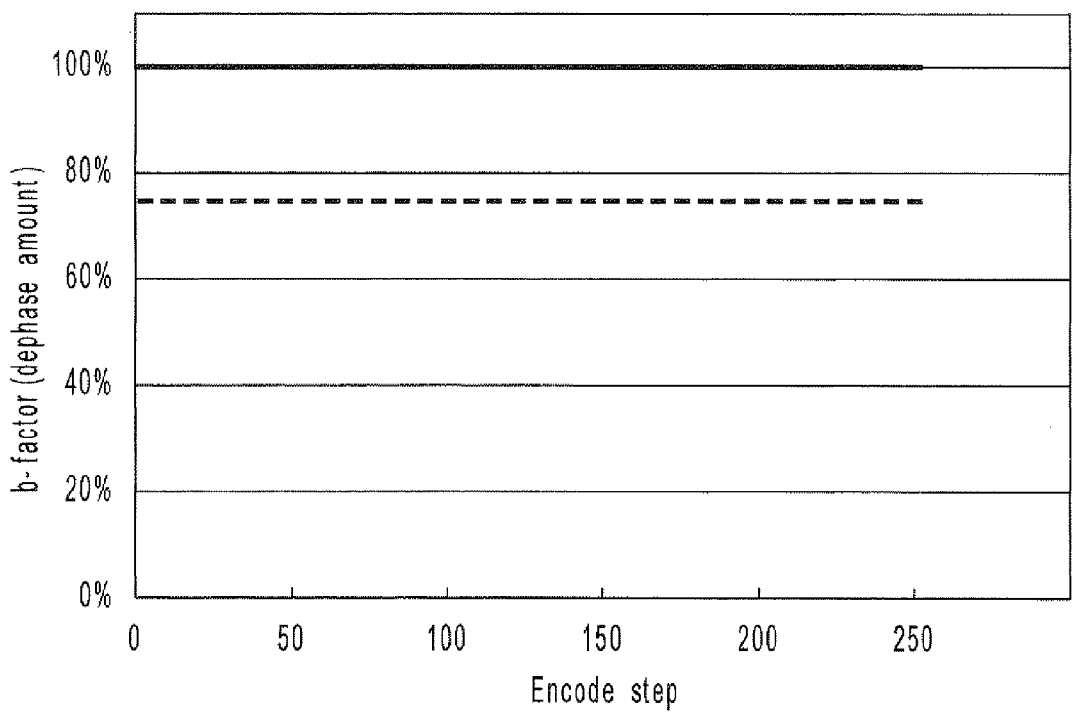
FIG. 26 is a diagram explaining a conventional method of setting the b-factor.

The intensity the gradient magnetic field should have in order to maintain the dephase amount at a particular value decreases as the encode step proceeds, as can be understood from, for example, FIG. 27. Thus, the gradient magnetic field becomes the most intensive at the time of the first encode step. The maximum gradient-magnetic-field intensity required to attain a desired dephase amount is higher than that (100%) of the most intensive magnetic field that can be generated in the magnetic resonance imaging diagnostic apparatus as indicated by the solid line in FIG. 27. In this case, the gradient magnetic field must be maintained at a low intensity, not to exceed the highest intensity possible in the diagnostic apparatus, all the time magnetic resonance signals are collected, as the broken line indicates in FIG. 27. Then, the largest dephase amount actually obtained inevitably decreases as indicated by the broken line in FIG. 26. The b-factor decreases more than the intensity of the gradient magnetic field, because it is proportional to the square of the intensity of the gradient magnetic field.

Since the dephase amount is limited, the shortening of the echo time TE is limited, too. Thus, it is difficult to reduce the decrease of TE sufficiently.

The third embodiment can therefore minimize the influence of the calcifications, successfully visualizing the blood vessels clearly.

In the third embodiment, the sequencer 10 includes the function of controlling the gradient power supply 7, transmitter 9T and receiver 9R to accomplish the FSBB imaging. More specifically, the sequencer 10 has the function of controlling the gradient power supply 7, transmitter 9T and receiver 9R by using a pulse sequence for the gradient echo system, while dephasing the spin about at least one of the slice axis, phase-encode axis and read-out axis. While performing this control to achieve this FSBB imaging, the sequencer 10 changes the dephase amount for the spin about at least one axis, at least one time, during the collection of magnetic resonance signals about one image.

The sequencer 10 further has the function of controlling the gradient power supply 7, transmitter 9T and receiver 9R, before the main scan is performed to collect magnetic resonance signals for the FSBB imaging. The preparation scan is thereby carried out several times, by using a different dephase amount each time, thus collecting magnetic resonance signals concerning the same slice.

The input device 14 has the function of inputting a preparation-image selecting instruction (described later) under the control of the host computer 16.

The host computer 16 has various functions. One of the functions is to make the arithmetic unit 11 reconstruct a plurality of preparation images on the basis of the magnetic resonance signals collected over the several preparation scans and to cause the display 13 to display the preparation images thus reconstructed. One of the above-mentioned functions is to set a target dephase amount that is used to collect the magnetic resonance signals for use in reconstructing any preparation image that the operator has selected by operating the input device 14.

How the MRI apparatus 100 operates in the third embodiment will be explained. The various imaging processes the MRI apparatus 100 performs as the existing MRI apparatuses do will not be described, nonetheless. Only the imaging process for acquiring the image of the penetrated branches will be explained here.

Figure 17:
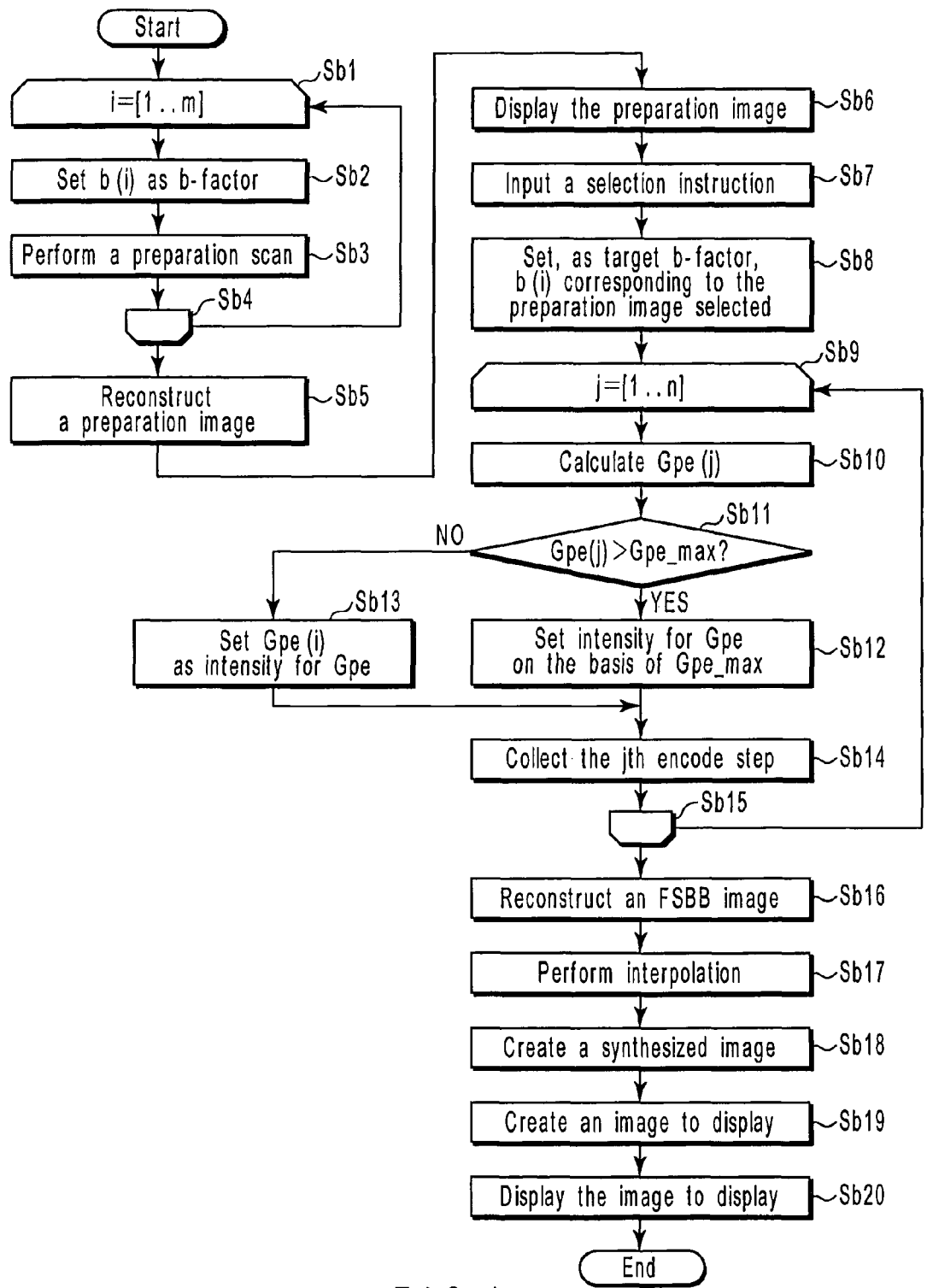
FIG. 17 is a flowchart explaining the sequence of processes performed by the host computer shown in FIG. 1 in order to achieve FSBB imaging.

FIG. 17 is a flowchart explaining the sequence of processes the host computer 16 performs in order to achieve the FSBB imaging.

In the process loop consisting of Steps Sb1 to Sb4, the host computer 16 repeats Steps Sb2 and Sb3, incrementing the variable i from 1 to m, each time by one (1).

In Step Sb2, the host computer 16 sets a prescribed value b(i) as b-factor. Value b(i) is one of, for example, six values b(1) to b(6), i.e., 0.1, 1, 4, 16, 32 and 64 sec/mm². In this case, variable m is "6."

In Step Sb3, the host computer 16 instructs the sequencer 10 to perform a preparation scan for one slice. Upon receiving the instruction, the sequencer 10 controls the gradient power supply 7, transmitter 9T and receiver 9R. The magnetic resonance signals the receiver 9R has received are thereby collected. The preparation scan is performed, first by fixing the b-factor at the value set in Step Sb2 and then by using the pulse sequence for the gradient echo system, while dephasing the spin about at least one of the slice, phase-encode and read-out axes.

The process loop consisting of Steps Sb1 to Sb4 is thereby carried out. At this time, the b-factor is changed for the same slice m times, performing m preparation scans. Therefore, m magnetic resonance signals corresponding to the different b-factors are collected.

Next, in Step Sb5, the host computer 16 instructs the arithmetic unit 11 to reconstruct preparation images. On receiving this instruction, the arithmetic unit 11 reconstructs m preparation images on the basis of the m magnetic resonance signals, one preparation image from one signal. Therefore, m preparation images corresponding to different b-factors are acquired. The preparation images are FSBB images, because the spin about at least one axis is dephased during the preparation scan and the magnetic resonance signals for the blood vessels are at low levels.

Figure 18:
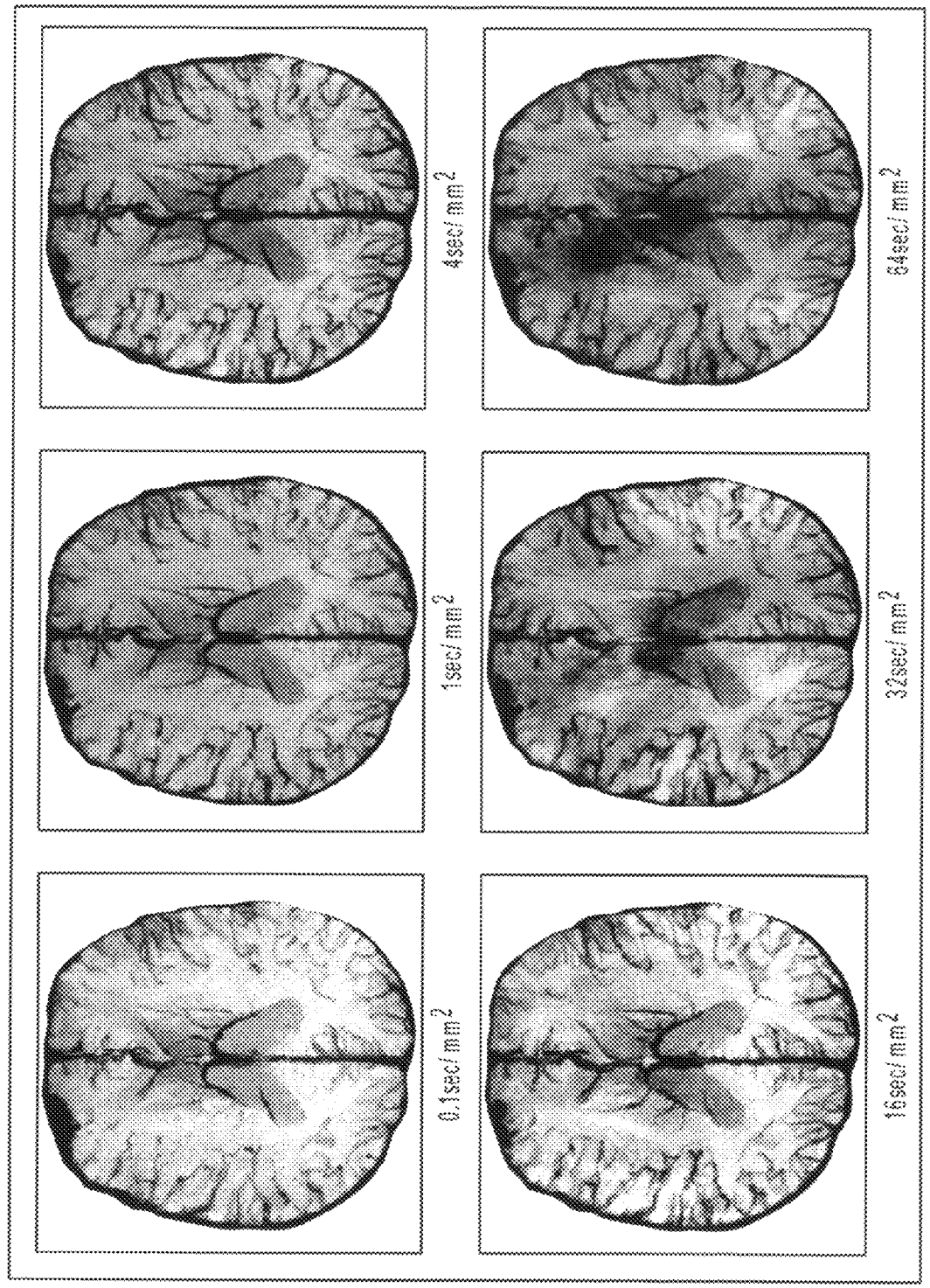
FIG. 18 is a diagram showing various preparation images to be displayed on the display shown in FIG. 1.

In Step Sb6, the host computer 16 causes the display 13 to display the preparation images. At this point, all preparation images, i.e., m preparation images, may be displayed as shown in FIG. 18. Alternatively, some of the preparation images may be displayed. Still alternatively, only one preparation image the operator has selected may be displayed.

As can be seen from FIG. 18, too, the larger the b-factor, the more clearly the blood vessels will be visualized in the FSBB image. There is a tendency that artifacts increase in numbers in proportion to the b-factor. Even if the b-factor remains the same, the ability of visualizing the blood vessels changes in accordance with the conditions of the subject 200. Therefore, the operator compares the m preparation images and operates the input device 14, selecting the best preparation image.

In Step Sb7, the host computer 16 instructs the input device 14 to input the data indicating that the best preparation image has been selected.

In Step Sb8, the host computer 16 sets a target b-factor as b-factor b(i) for the preparation image selected.

In the process loop consisting of Steps Sb9 to Sb15, the host computer 16 repeats Steps Sb10 to Sb14 several times, increasing variable j from 1 to n, by one (1) each time Steps Sb10 to Sb14 are performed. Note that n is the number of phase encode steps performed to collect magnetic resonance signals for one slice, and is, for example, "256."

In Step Sb10, the host computer 16 finds the intensity Gpe(j) that the phase-encode gradient magnetic field Gpe should have to achieve the target b-factor in the jth phase encode step.

In Step Sb11, the host computer 16 determines whether the intensity Gpe(j) is equal to or higher than the maximum intensity Gpe_max for the phase-encode gradient magnetic field. The maximum intensity Gpe_max is determined by the abilities of the coils 6x, 6y and 6z and the ability of the gradient power supply 7. If the intensity Gpe(j) higher than the maximum intensity Gpe_max, the host computer 16 sets the intensity of the phase-encode gradient magnetic field Gpe in accordance with the maximum intensity Gpe_max. More precisely, the host computer 16 first calculates the b-factor for the case where the maximum intensity Gpe_max is set for the phase-encode gradient magnetic field Gpe. Then, the host computer 16 sets the b-factor calculated, as a dephase amount for the encode step. The host computer 16 calculates the intensity Gpe(j) on the basis of the b-factor and sets this b-factor as the intensity of the phase-encode gradient magnetic field Gpe. If the intensity Gpe(j) is not higher than the maximum intensity Gpe_max, the host computer 16 sets, in Step Sb13, the intensity Gpe(j) calculated in Step Sb10, as the intensity of the phase-encode gradient magnetic field Gpe.

In Step Sb14, the host computer 16 instructs the sequencer 10 to collect magnetic resonance signals concerning the jth encode step. Upon receiving the instruction, the sequencer 10 controls the gradient power supply 7, transmitter 9T and receiver 9R so that the magnetic resonance signals concerning the jth encode step may be collected. The magnetic resonance signals the receiver 9R has received are thereby collected. This collection of magnetic resonance signals is accomplished by a pulse sequence for the gradient echo system, while dephasing the spin of the phase-encode axis for which the intensity of the phase-encode gradient magnetic field Gpe has been set in Step Sb12 or Sb13.

The process loop consisting of Steps Sb9 to Sb15 is thereby carried out. At this time, all magnetic resonance signals necessary in n phase encode steps for one slice are collected. This process of collecting magnetic resonance signals is the main scan. The gradient magnetic field for attain the target b-factor may change as indicated by the broken line shown in FIG. 19. In this case, the phase-encode gradient magnetic field Gpe changes in intensity as indicated by the solid line in FIG. 19. As a result, the b-factor is changed in the main scan as the solid line shows in FIG. 20. That is, the b-factor gradually increases as the phase encode process goes on, though it is smaller than the target b-factor in the first phase-encode step. When the b-factor reaches the target b-factor, it is fixed at the target b-factor.

Hitherto, the b-factor has been usually not changed during the scanning. This is because the dephasing has been generally used in order to perform diffusion imaging in the scanning in which the b-factor is used as an input parameter, and the b-factor should better be constant to facilitate the calculation of a diffusion coefficient. In the third embodiment, however, the b-factor is changed in the main scan, unlike in the conventional MIR apparatus.

Although not shown in the drawing, it may be necessary to perform the main scan so that slice encoding may be achieved for a plurality of slices or in 3D imaging. In this case, the process loop consisting of Steps Sb9 to Sb15 is carried out for each phase encode step or slice encode step. At this point, the slice gradient magnetic field Gss is set so that the b-factor may become constant, or set to have the same intensity as the phase-encode gradient magnetic field Gpe.

In most cases, the intensity of a gradient magnetic field exceeds the upper limit in any encode step, when it changes in the slice direction or the phase-encode direction, and does not exceed the upper limit when it changes in the read-out direction. Therefore, it is desired to fix the dephase amount when the intensity of the gradient magnetic field changes in the read-out direction, and to change the dephase amount to the upper limit, only in such an encode step in which the intensity of the gradient magnetic field may exceed the upper limit.

Figure 22:
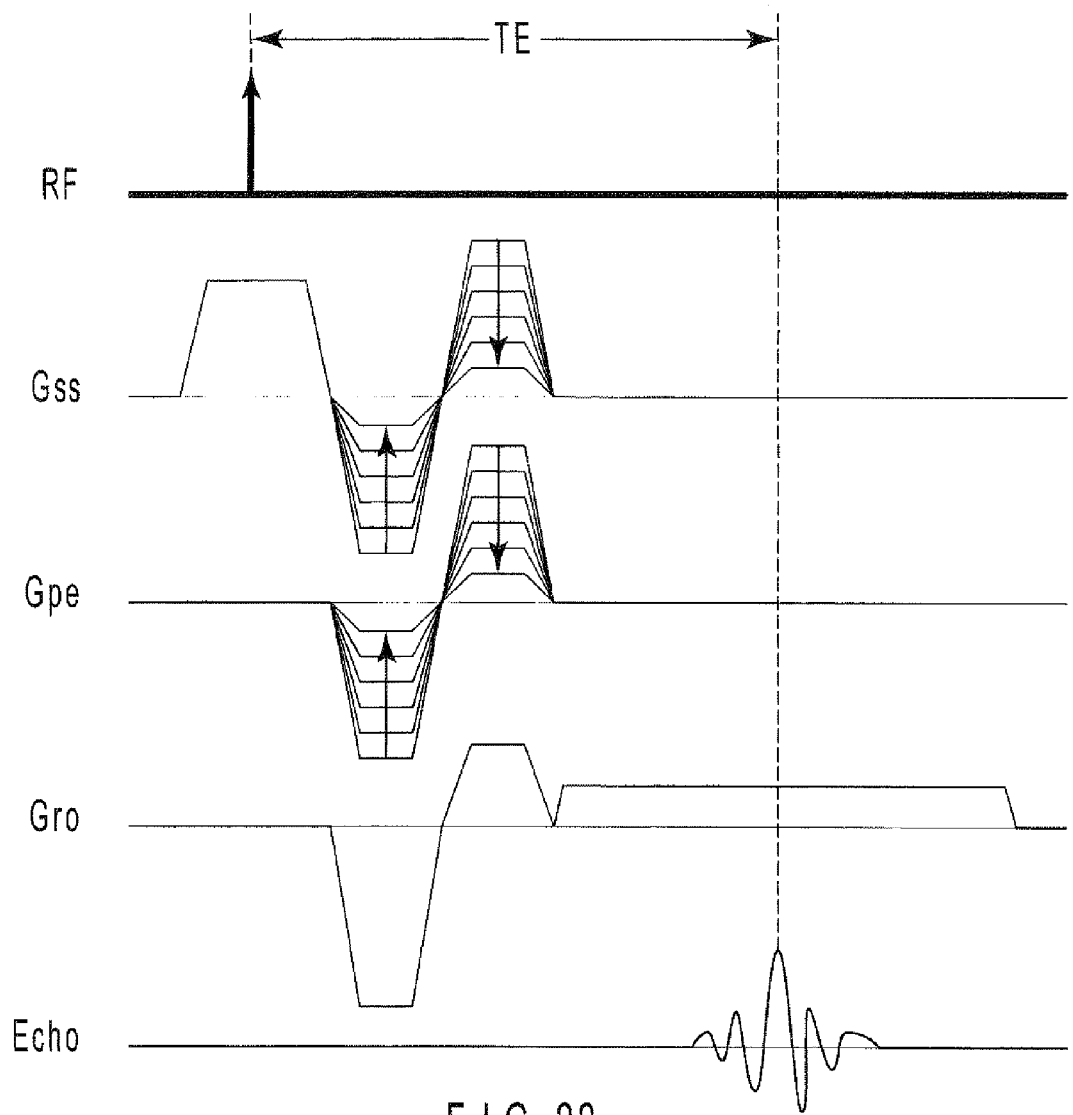
FIG. 22 is a diagram showing a pulse sequence applied in the conventional FSBB imaging.

FIG. 21 is a diagram showing a pulse sequence applied in the main scan in the third embodiment. This pulse sequence is basically similar to the pulse sequence for use in the conventional FSBB imaging shown in FIG. 22. Nonetheless, the phase-encode gradient magnetic field Gpe and the slice gradient magnetic field Gss change in intensity in each encode step as schematically illustrated in FIG. 21.

FIG. 21 shows only that part of the pulse sequence, which corresponds to the period of 1TE. This pulse sequence can be applied to the spin warp method, echo planar imaging method, echo-shifted method and multi-echo method, all based on such a pulse sequence. In the spin warp method, the RF excitation and the process of collecting echo signals are repeated in each repeating period TR that is longer than the echo time TE. In the echo planar imaging method, the echo signals for the lines in the k-space are collected when the RF excitation is performed once in each repeating period TR. In the echo-shifted method, the RF excitation and the process of collecting echo signals are repeated in each repeating period TR that is shorter than the echo time TE. That is, the echo signals generated during the RF excitation performed in a certain repeating period TR are collected not in the same period, but in the next period. In the multi-echo method, the echo signals for the same line in the k-space are collected when the RF excitation is performed once in each repeating period TR.

In Step Sb16, the host computer 16 instructs the arithmetic unit 11 to reconstruct the image on the basis of the data acquired as described above. On receiving the instruction, the arithmetic unit 11 reconstructs the image by, for example, a known method. This image reconstruction provides an amplitude image, a phase image and 3D volume data.

In Step Sb17, the host computer 16 instructs the arithmetic unit 11 to perform interpolation on the image reconstructed. On receiving the instruction, the unit 11 performs the known interpolation process. The interpolation process may not be carried out.

In Step Sb18, the host computer 16 instructs the arithmetic unit 11 to synthesize an image. Upon receiving this instruction, the unit 11 creates a synthesized image from, for example, the amplitude image and the phase image. The process of creating the amplitude image may not be performed.

In Step Sb19, the host computer 16 instructs the arithmetic unit 11 to create an image to display. On receiving this instruction, the arithmetic unit 11 creates an image to display, by the known method. The image thus created shows the blood vessel as a continuous tube. This process of creating an image may be a projection such as the maximum intensity projection (MIP), the minimum intensity projection (minIP), or the integral projection. The data representing the surface of any blood vessel may be extracted in order to apply volume rendering or surface rendering. Alternatively, the multi-planar reconstruction (MPR) may be employed to enable the doctor to observe the original image signal.

In Step Sb20, the host computer 16 causes the display 13 to display the image created in step Sb19, amplitude image or phase image, in accordance with the operator's instruction.

Figure 23:
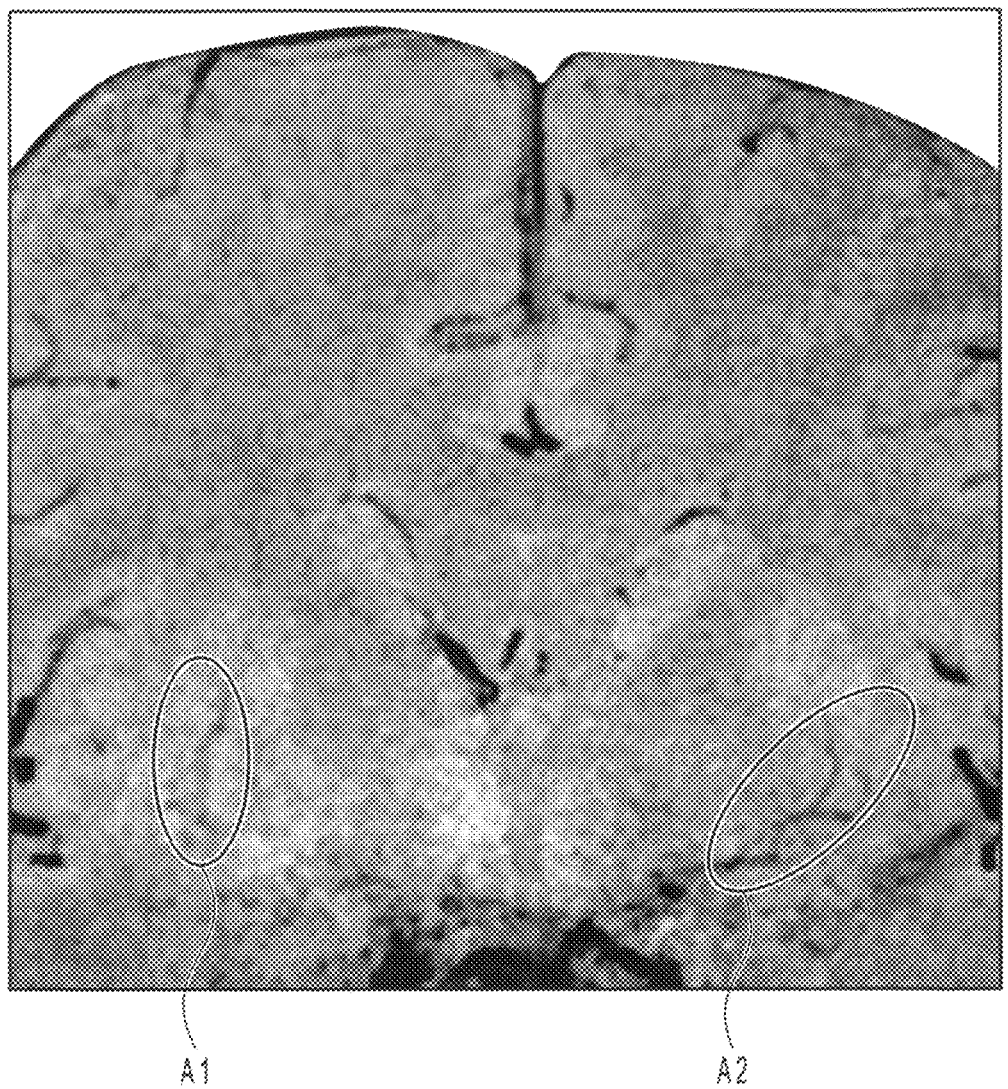
FIG. 23 is a diagram showing an image of the head, which has been acquired by changing the b-factor for the purpose of visualizing a penetrated branches of the head.

In the third embodiment, the dephase amount is smaller than the target b-factor in the first phase encode step, but is gradually increased to the target b-factor as the phase encode process goes on. Thus, the dephase amount can be larger than in the case it is set as indicated by the broken line in FIG. 26. This enhances the ability of visualizing the blood vessels. FIGS. 23 and 24 are diagrams showing images of the head, which have been acquired by changing no conditions but the b-factor, for the purpose of visualizing the penetrated branches present in the head. More specifically, the image shown in FIG. 23 has been obtained by applying a b-factor of 1 sec/mm² for the read-out direction, a b-factor of 0.3 sec/mm² for the first half of the encode step, and a b-factor of 1 sec/mm² for the latter half of the encode step. The image shown in FIG. 24 has been obtained by applying a b-factor of 0.3 sec/mm² for all directions throughout the encode step. Note that, as seen from FIG. 23, the ability of the visualizing the penetrated branches is higher in regions A1 and A2 than in regions A3 and A4 that are shown in FIG. 24.

In the third embodiment, the b-factor is so changed as to become maximal in each encode step, not so simply as in the case of providing the image shown in FIG. 23. The ability of visualizing the penetrated branches is therefore high.

The present embodiments can be modified in various ways, as will be described below.

In the first embodiment, the dephase amount and the polarity need not be constant. Dephasing need not be performed in three axes. It may rather be performed in two axes or one axis. If this is the case, rephasing may be performed in the remaining axis or axes. Further, dephasing may be performed, not in all encodes, but in 0 encode only. Still further, the axes for dephasing or the encode steps may be limited.

In the second embodiment, the axes for rephasing and the encode steps may be changed. Moreover, the third-order moment and any higher-order moment may be large enough to cancel the amplitude attenuation or the phase shift, either due to the flow.

Figure 13:
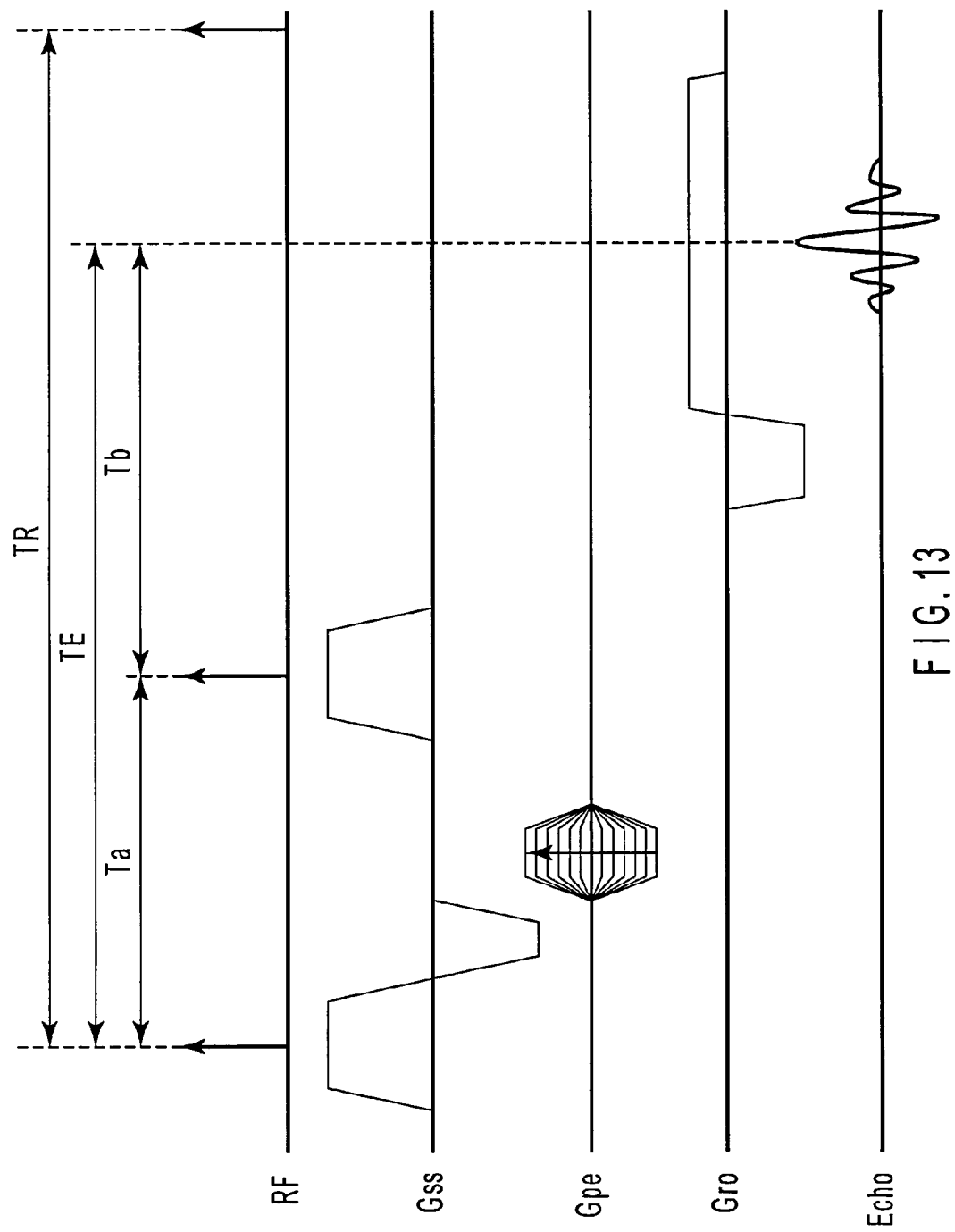
FIG. 13 is a diagram visualizing a pulse sequence for an asymmetric spin-echo system.

In the first and second embodiments, the pulse sequence may be a two-dimensional (2D) one, not a 3D one as exemplified above. The pulse sequence for an asymmetric spin-echo system can be used in place of the pulse sequence for the gradient echo method. As shown in FIG. 13, the time Ta from the application of an excitation pulse (usually, a 90° pulse) to the application of an inversion pulse (usually, a 180° pulse), and the time Tb from the application of the inversion pulse to the echo peak are deviated from TE/2 in the pulse sequence for the asymmetric spin-echo system. In the pulse sequence for the asymmetric spin-echo system, the larger the difference between the time Ta and the time Tb, the more greatly the non-uniformity of the local magnetic field will influence the image contrast. Therefore, the difference between the time Ta and the time Tb is adjusted, not the echo time TE as in the first embodiment, because the sequence for the asymmetric spin-echo system is utilized. Since the sequence for the asymmetric spin-echo system is used, the echo time TE need not be changed. Hence, images that differ in the influence of the non-uniformity of the local magnetic field can be obtained, while the $T_2$ effect remains constant.

In the third embodiment, of the gradient magnetic fields for all encode steps, the most intensive one may be set to a value smaller than the upper limit.

In the third embodiment, the b-factor for any gradient magnetic field may be changed only once, in order to provide such an image as shown in FIG. 23.

In the third embodiment, the target b-factor may be a value that the operator directly selects.

In the third embodiment, the signal-to-noise ratio (SNR) at the head may be automatically measured for each dephase amount, and the target b-factor may set to such a value as would render this SNR maximal.

In the third embodiment, any preparation scan need not be performed for the same time as the main scan. Rather, the preparation scan may be performed for a shorter time than the main scan, by reducing the number of encodes or by imaging only one slice by means of a 2D scan so that the doctor may visually determine the degree of visualizing the blood vessels.

In the third embodiment, any preparation scan may be performed by a method other than changing the dephase amount. For example, the preparation scan may be performed by the phase contrast method that can provide such an image as shown in FIG. 25. The phase contrast method is a technique of visualizing the blood flows by using the phase information about a spin. The phase shift of the spin, which occurs after the gradient magnetic field is applied, depends on the intensity of the gradient magnetic field and the velocity of the spin.

That is, the phase of the spin is a function of its velocity and the gradient magnetic field. This is one of the characterizing features of the phase contrast method. Thus, the target b-factor can be set as b-factor that induces phase dispersion necessary to generate a signal representing a blood vessel, whose level is far lower than a signal representing the fastest one of the blood flows to be imaged.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic resonance imaging (MRI) diagnostic apparatus comprising:
    MRI system components including static and gradient magnetic field generators, at least one radio frequency (RF) coil coupled to an examination space within magnetic fields generated by the static and gradient magnetic field generators, an RF transmitter, an RF receiver and a control computer system connected to control other MRI system components, said control computer system including at least one computer and memory configured to
    controllably generate a slice gradient magnetic field, a phase-encode gradient magnetic field and a read-out gradient magnetic field that extend in a slice axis, a phase-encode axis and a read-out axis, respectively;
    use gradient magnetic fields to effect a gradient echo pulse sequence, which includes a dephase gradient-magnetic-field pulse in at least a selected one of the slice axis, phase-encode axis and read-out axis, the dephase gradient-magnetic field pulse being adjusted in the gradient echo pulse sequence to a dephase amount which weights a signal-level decrease resulting from flow in both arteries and veins present in a region of interest of a subject and also concurrently suppresses a signal-level decrease in surrounding background tissues of both the arteries and veins;
    collect magnetic resonance signals generated in the region of interest by nuclear magnetic resonance; and
    generate an image of the region of interest using collected magnetic resonance signals wherein image pixel values of both the arteries and veins are lower than pixel values of the background tissues as a result of said dephase amount having been used during generation of the magnetic resonance signals,
    wherein the imaging conditions are set such that a difference in magnetic susceptibility is weighted in the contrast of a created image to result in said created image having both emphasized flow and susceptibility.

2. The magnetic resonance imaging diagnostic apparatus according to claim 1, wherein a projection process is performed in a direction at right angles to the direction of a static magnetic field, thereby to create a cross section image about the region of interest.

3. The magnetic resonance imaging diagnostic apparatus according to claim 1, wherein the created image is a magnetic resonance angiograph obtained without using contrast mediums.

4. The magnetic resonance imaging diagnostic apparatus according to claim 1, which further comprises:
    a plurality of RF coil elements configured to respectively receive magnetic resonance signals and wherein parallel imaging is performed in which a difference in sensitivity between the plurality of coil elements is used to omit encode steps for the phase-encode axis.

5. The magnetic resonance imaging diagnostic apparatus according to claim 4, further comprising:
    generate a plurality of amplitude images and a plurality of phase images from the magnetic resonance signals respectively received by the plurality of coil elements, synthesize the phase images to create a synthesized phase image and apply the synthesized phase image to the amplitude images, thereby creating an image in which a phase difference is weighted in contrast.

6. The magnetic resonance imaging diagnostic apparatus according to claim 1, wherein:
    the dephase amount defined by the dephase gradient-magnetic-field pulse is changed for each encode amount.

7. The magnetic resonance imaging diagnostic apparatus according to claim 1, wherein:
    the dephase amount defined by the dephase gradient-magnetic-field pulse is changed for only some encode amounts.

8. The magnetic resonance imaging diagnostic apparatus according to claim 1, which further comprises:
    a storage unit configured to store information representing a relation between parts for which a signal-level decrease should be weighted and respectively corresponding dephase amounts by which signal-level decreases should be weighted;
    said control computer system being further configured to determine a part of an imaged body for which the signal-level decrease should be weighted; and
    set a dephase amount which is associated with the determined part determined by the part-determining unit based on the information stored in the storage unit as the dephase amount for weighting the arteries and the veins.

9. The magnetic resonance imaging diagnostic apparatus according to claim 1, wherein said control system is further configured to:
    generate a plurality of magnetic resonance signals for a slice, by changing the dephase amount;
    create a plurality of preparation images concerning the region of interest from the plurality of magnetic resonance signals; and
    set the dephase amount based on the plurality of preparation images.

10. The magnetic resonance imaging diagnostic apparatus according to claim 1, wherein said control system is further configured to:
    generate a plurality of magnetic resonance signals for a slice with respectively corresponding changed dephase amounts;
    create a plurality of preparation images of the region of interest from the plurality of magnetic resonance signals;
    display the plurality of preparation images;
    determine one of the plurality of preparation images, which an operator has selected; and
    set the dephase amount for the preparation image determined by the image-determining unit, as the dephase amount for weighting the arteries and the veins.

11. The magnetic resonance imaging diagnostic apparatus according to claim 1, wherein the dephase amount is set to a value of b-factor falling within a range of 0.1 to 50 sec/mm$^2$.

12. The magnetic resonance imaging diagnostic apparatus according to claim 1, wherein the dephase amount is set to a value of b-factor falling within a range of 1 to 20 sec/mm$^2$.

13. The magnetic resonance imaging diagnostic apparatus according to claim 1, wherein:
an echo time is set such that the non-uniformity of a local magnetic field is not reflected in contrast of generated image.

14. The magnetic resonance imaging diagnostic apparatus according to claim 1, wherein:
an echo time is set such that the non-uniformity of a local magnetic field is reflected in contrast of generated image.

15. The magnetic resonance imaging diagnostic apparatus according to claim 1, wherein said control system is configured to:
generate at least one of (a) an amplitude image based on the amplitude of the magnetic resonance signal, (b) a phase image based on the phase of the magnetic resonance signal and (c) a synthesized image provided by synthesizing the amplitude image and the phase image.

16. The magnetic resonance imaging diagnostic apparatus according to claim 15, wherein:
a three-dimensional process is performed on the amplitude image, the phase image or the synthesized image, thereby creating a three-dimensional image.

17. The magnetic resonance imaging diagnostic apparatus according to claim 16, wherein:
the three-dimensional process is one of a minimum intensity projection, (ii) maximum intensity projection or integral projection, (iii) volume rendering, (iv) surface rendering, or (v) multi-planar reconstruction.

18. The magnetic resonance imaging diagnostic apparatus according to claim 1, wherein the control system is further configured to:
subtract a phase shift determined by the known magnetic susceptibility of a tissue, from the phase shift determined by a magnetic resonance signal generated in the subject by using the pulse sequence, thereby determining a phase shift corresponding to a flow of the tissue.

19. The magnetic resonance imaging diagnostic apparatus according to claim 1, wherein:
the pulse sequence is a spin warp method.

20. The magnetic resonance imaging diagnostic apparatus according to claim 1, wherein:
the pulse sequence is an echo planar imaging method.

21. The magnetic resonance imaging diagnostic apparatus according to claim 1, wherein:
the pulse sequence is an echo-shifted method.

22. The magnetic resonance imaging diagnostic apparatus according to claim 1, wherein:
the pulse sequence is a multi-echo method.

23. A magnetic resonance imaging diagnostic apparatus as in claim 1, wherein:
first-order rephasing to nth-order rephasing (n being 2 or a greater integer) is performed on a spin with respect to at least one axis selected from the slice, phase-encode and read-out axes, and a pulse sequence is achieved for a gradient echo system in which an echo period is set to a value substantially reducing a phase shift of a vein present in a region of interest of a subject.

24. The magnetic resonance imaging diagnostic apparatus according to claim 23, wherein:
the pulse sequence is a spin warp method.

25. The magnetic resonance imaging diagnostic apparatus according to claim 23, wherein:
the pulse sequence is an echo planar imaging method.

26. The magnetic resonance imaging diagnostic apparatus according to claim 23, wherein:
the pulse sequence is an echo-shifted method.

27. The magnetic resonance imaging diagnostic apparatus according to claim 23, wherein:
the pulse sequence is a multi-echo method.

28. A magnetic resonance imaging diagnostic apparatus as in claim 1, wherein said control system is further configured to:
perform first-order to nth-order rephasing (n being 2 or a greater integer) on a spin with respect to at least one axis selected from the slice phase-encode axis, phase-encode axis and read-out axis, and which controls the first generating unit to achieve a pulse sequence for an asymmetric spin-echo system in which an echo period is set to a value substantially reducing a phase shift of a vein present in a region of interest of a subject.

29. The magnetic resonance imaging diagnostic apparatus according to claim 28, wherein said control system is further configured to:
generate an image of the region of interest, from a magnetic resonance signal generated in the region of interest by nuclear magnetic resonance, and in which a difference is set between a time from an application of an excitation pulse to the application of an inversion pulse and a time from the application of the inversion pulse to the occurrence of an echo peak, a value such that a non-uniformity of a local magnetic field is not reflected in contrast of a created image.

30. The magnetic resonance imaging diagnostic apparatus according to claim 28, wherein said control system is further configured to:
generate an image of the region of interest, from a magnetic resonance signal generated in the region of interest by nuclear magnetic resonance, and in which a difference is set between a time from an application of an excitation pulse to the application of an inversion pulse and a time from the application of the inversion pulse to the occurrence of an echo peak, to a value such that a non-uniformity of a local magnetic field is reflected in the contrast of a created image.

31. A magnetic resonance imaging diagnostic apparatus as in claim 1, further comprising:
collect magnetic resonance signals generated in a subject lying in a static magnetic field, when a radio-frequency pulse is applied, while applying a slice gradient magnetic field, a phase-encode gradient magnetic field and a read-out gradient magnetic field in a slice axis, a phase-encode axis and a read-out axis, respectively; and
dephase a spin about at least one axis selected from the slice phase-encode axis, phase-encode axis and read-out axis, and by using a pulse sequence for gradient echo imaging, while changing a dephase amount for the spin at least once during collection of the magnetic resonance signals for an image.

32. The magnetic resonance imaging diagnostic apparatus according to claim 31, wherein:
spins are dephased about some of the slice, phase encode and read-out axes, and changes a dephase amount for at least one axis selected from said some of the axes.

33. The magnetic resonance imaging diagnostic apparatus according to claim 31, wherein:
when a gradient magnetic field providing a prescribed target dephase amount has an intensity exceeding a reference value, the dephase amount is set to a value acquired from a gradient magnetic field that has an intensity equal to or smaller than a reference value, and after the intensity of the gradient magnetic field ceases to exceed the reference value, MR system components change the dephase amount to a target dephase amount.

34. The magnetic resonance imaging diagnostic apparatus according to claim 33, wherein:

until the dephase amount is changed to the target dephase amount, the dephase amount is maintained at a value attained from the gradient magnetic field whose intensity has the reference value.

35. The magnetic resonance imaging diagnostic apparatus according to claim 33, wherein:

the dephase amount is changed to the target dephase amount when the intensity of the gradient magnetic field ceases to exceed the reference value.

36. The magnetic resonance imaging diagnostic apparatus according to claim 33, further comprising:

setting the target dephase amount.

37. The magnetic resonance imaging diagnostic apparatus according to claim 36, which further comprises:

perform a preparation scan several times for a respectively changed dephase amount at each preparation scan, before a main scan is performed by changing the dephase amount in order to collect magnetic resonance signals, and reconstruct a plurality of preparation images corresponding to said changed dephase amounts, based on the magnetic resonance signals collected in the respectively associated preparation scans, and in which one of preparation images is selected and sets the target dephase amount as a dephase amount is set for a preparation image selected.

38. The magnetic resonance imaging diagnostic apparatus according to claim 37, which further comprises:

display the plurality of preparation images and inputting an instruction for selecting one of the preparation images, and in which one of the plurality of preparation images is selected in accordance with the instruction.

39. The magnetic resonance imaging diagnostic apparatus according to claim 37, wherein:

a preparation scan is performed several times, by changing the dephase amount at each preparation scan faster than the main scan.

40. A method of controlling a magnetic resonance imaging diagnostic apparatus comprising MRI system components including static and gradient magnetic field generators, at least one radio frequency (RF) coil coupled to an examination space within magnetic fields generated by the static and gradient magnetic field generator, an RF transmitter, an receiver and a control computer system connected to control other MRI system components, said control computer system including at least one computer and memory, the method comprising:

controlling the MRI system components to effect a gradient echo pulse sequence, which includes a dephase gradient-magnetic-field pulse in at least a selected one of the slice axis, phase-encode axis and read-out axis, the dephase gradient-magnetic field pulse being adjusted in a gradient echo pulse sequence to a dephase amount which weights a signal-level decrease resulting from flow in both arteries and veins present in a region of interest of a subject and also concurrently suppresses a signal-level decrease in surrounding background tissues of both the arteries and veins;

collect magnetic resonance signals generated in the region of interest by nuclear magnetic resonance; and generate an image of the region of interest using collected magnetic resonance signals wherein image pixel values of both the arteries and veins are lower than pixel values of the background tissues as a result of said dephase amount having been used during generation of the magnetic resonance signals, wherein said controlling step causes imaging conditions to be set such that a difference in magnetic susceptibility is weighted in the contrast of the image generated by the generating step to result in said image having both emphasized flow and susceptibility.

41. A method of controlling a magnetic resonance imaging diagnostic apparatus as in claim 40, comprising:

performing first-order rephasing to nth-order rephasing (n being 2 or a greater integer) on a spin with respect to at least one axis selected from the slice, phase-encode and read-out axes, and which controls the generating unit to achieve a pulse sequence for a gradient echo system in which an echo period is set to a value substantially reducing a phase shift of a vein present in a region of interest of a subject.

42. A method of controlling a magnetic resonance imaging diagnostic apparatus as in claim 40, further comprising:

using a pulse sequence for an asymmetric spin-echo system, which includes a dephase gradient-magnetic-field pulse that corresponds to the dephase amount set with respect to said at least one axis in the setting of a dephase amount.

43. A method of controlling a magnetic resonance imaging diagnostic apparatus as in claim 40, further comprising:

performing first-order rephasing to nth-order rephasing (n being 2 or a greater integer) on a spin with respect to at least one axis selected from the slice, phase-encode and read-out axes, and controlling MR system to achieve a pulse sequence for an asymmetric spin-echo system in which an echo period is set to a value substantially reducing a phase shift of a vein present in a region of interest of a subject.

44. A method of controlling a magnetic resonance imaging diagnostic apparatus as in claim 40, further comprising:

collecting magnetic resonance signals generated in a subject lying in a static magnetic field, when a radio-frequency pulse is applied, while applying a slice gradient magnetic field, a phase-encode gradient magnetic field and a read-out gradient magnetic field in a slice axis, a phase-encode axis and a read-out axis, respectively; and dephasing a spin about at least one axis selected from the slice phase-encode axis, phase-encode axis and read-out axis, and by using a pulse sequence for gradient echo imaging, while changing a dephase amount for the spin at least once during collection of the magnetic resonance signals for an image.

\* \* \* \* \*